US012791599B2

(12) United States Patent
Kashiwase et al.

(10) Patent No.: US 12,791,599 B2
(45) Date of Patent: Nov. 10, 2026

(54) PARTIAL-DISCHARGE DIAGNOSTIC DEVICE, PARTIAL-DISCHARGE DIAGNOSTIC METHOD, AND PARTIAL-DISCHARGE DIAGNOSTIC SYSTEM

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Shoichi Kashiwase, Chigasaki Kanagawa (JP); Takashi Harakawa, Yokohama Kanagawa (JP); Takahiro Miura, Yokohama Kanagawa (JP); Hirotaka Tsubakihara, Tokyo (JP); Yuuya Okano, Yokohama Kanagawa (JP); Akihiko Hirose, Kamakura Kanagawa (JP); Tomoaki Takahashi, Yokohama Kanagawa (JP); Yudai Nemoto, Tokyo (JP); Akira Fujimoto, Kawasaki Kanagawa (JP)

(73) Assignees: KABUSHIKI KAISHA TOSHIBA, Toyko (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 153 days.

(21) Appl. No.: 18/680,332

(22) Filed: May 31, 2024

(65) Prior Publication Data

US 2025/0306079 A1 Oct. 2, 2025

(30) Foreign Application Priority Data

Mar. 26, 2024 (JP) ................................ 2024-049701

(51) Int. Cl.
*H01H 31/12* (2006.01)
*G01R 31/12* (2020.01)
*G06T 11/26* (2026.01)

(52) U.S. Cl.
CPC .......... *G01R 31/1272* (2013.01); *G06T 11/26* (2026.01)

(58) Field of Classification Search
CPC ................ G01R 31/12; G01R 31/1218; G01R 31/1227; G01R 31/1272; G06T 11/206
See application file for complete search history.

(56) References Cited

U.S. PATENT DOCUMENTS 5,200,737 A 4/1993 Konishi et al.
6,161,077 A * 12/2000 Fawcett ............... G01R 31/083 324/528

(Continued)

FOREIGN PATENT DOCUMENTS

EP 4 321 881 A1 2/2024
EP 4 535 013 A1 4/2025

(Continued)

OTHER PUBLICATIONS

JP Office Action issued to the Japanese Patent Application No. 2024-049701 dated Apr. 22, 2025 (11 pages).

*Primary Examiner* — Thang X Le
(74) *Attorney, Agent, or Firm* — Foley & Lardner LLP

(57) ABSTRACT

According to the present embodiment, a partial-discharge diagnostic device is a device that performs determination of a factor of partial discharge in an insulator and includes a processor and a learning model generator. The processor is configured to generate data in a predetermined format with a pseudo partial-discharge signal reduced in an electric signal varying with a phase. The learning model generator is configured to generate a learning model that determines, (Continued)

based on the data, at least either the factor of the partial discharge or whether the partial discharge is present.

16 Claims, 29 Drawing Sheets

(56) References Cited

U.S. PATENT DOCUMENTS

| | | | | |
|---|---|---|---|---|
| 11,567,143 | B2 | 1/2023 | Yamada et al. | |
| 2017/0168024 | A1* | 6/2017 | Dehghan Niri .... | G01R 31/1227 |
| 2018/0062372 | A1* | 3/2018 | Lee .................... | G01R 31/1272 |
| 2021/0255232 | A1* | 8/2021 | Chae .................. | G01R 31/1272 |
| 2024/0183894 | A1* | 6/2024 | Yamada ................. | G01R 31/14 |

FOREIGN PATENT DOCUMENTS

| | | | |
|---|---|---|---|
| JP | H04-204270 | A | 7/1992 |
| JP | H07-181219 | A | 7/1995 |
| JP | 2003-307539 | A | 10/2003 |
| JP | 2019-200068 | A | 11/2019 |
| JP | 2020-046202 | A | 3/2020 |
| JP | 2021-130134 | A | 9/2021 |
| JP | 2022-161713 | A | 10/2022 |
| JP | 7203292 | B1 | 1/2023 |
| JP | 7280209 | B2 | 5/2023 |
| JP | 2023-180397 | A | 12/2023 |
| KR | 20220043548 | * | 1/2022 |

* cited by examiner

PARTIAL-DISCHARGE DIAGNOSTIC DEVICE, PARTIAL-DISCHARGE DIAGNOSTIC METHOD, AND PARTIAL-DISCHARGE DIAGNOSTIC SYSTEM

CROSS-REFERENCE TO RELATED APPLICATIONS

This application is based upon and claims the benefit of priority from the prior Japanese Patent Application No. 2024-049701, filed on Mar. 26, 2024 the entire contents of which are incorporated herein by reference.

FIELD

The embodiments of the present invention relate to a partial-discharge diagnostic device, a partial-discharge diagnostic method, and a partial-discharge diagnostic system.

BACKGROUND

Plant facilities include electric devices such as a generator, an electric motor, an inverter device, a switch gear, and a cable. The electric devices include an insulator on a conductor surface. The insulation performance of the insulator deteriorates over time. Repetition of thermal expansion and contraction caused by a temperature change, for example, in a generator coil of the generator deteriorates the insulator. Such deterioration of the insulator may cause a failure of an electrical power facility due to dielectric breakdown.

It is known that partial discharge occurs from the electric device when the insulator has deteriorated. Accordingly, determination of the insulation condition is performed based on the phenomenon of occurrence of partial discharge.

DETAILED DESCRIPTION

Figure 1A:
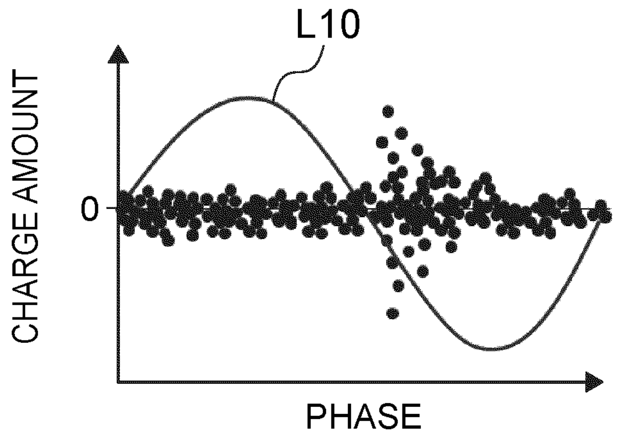
FIGS. 1A to 1C are diagrams illustrating differences in aspects of φ-q pattern diagrams for respective factors of partial discharge.

According to the present embodiment, a partial-discharge diagnostic device is a device that performs determination of a factor of partial discharge in an insulator and includes a processor and a learning model generator. The processor is configured to generate data in a predetermined format with a pseudo partial-discharge signal reduced in an electric signal varying with a phase. The learning model generator is configured to generate a learning model that determines, based on the data, at least either the factor of the partial discharge or whether the partial discharge is present.

A partial-discharge diagnostic device, a partial-discharge diagnostic method, and a partial-discharge diagnostic system according to the present embodiment are described below in detail with reference to the drawings. The embodiments described below are only examples of the embodiments of the present invention and the present invention is not limited to the embodiments. In the drawings referred to in the embodiments, same parts or parts having identical functions are denoted by like or similar reference characters and there is a case where redundant explanations thereof are omitted. Further, for convenience of explanation, there are cases where dimensional ratios of the parts in the drawings are different from those of actual products and some part of configurations is omitted from the drawings. First, partial discharge and pseudo partial-discharge are described below with reference to FIG. 1 to FIG. 3.

Aspects of Partial Discharge in Insulator

Aspects of partial discharge in an insulator are described with reference to FIGS. 1A to 1C. A φ-q pattern diagram is a diagram illustrating the relation between the phase of an applied voltage and the value of an electric signal. The electric signal is a signal corresponding to the phase of an applied voltage applied to an electric device or the like. For example, the electric signal is at least any of the charge amount, a current, and a voltage that vary with the phase. Therefore, the electric signal in the present embodiment includes at least any of a charge amount signal, a current signal, and a voltage signal that vary with the phase.

Although the description of the present embodiment is provided by referring to the charge amount signal as the electric signal, the present embodiment is not limited thereto. For example, either the current signal or the voltage signal can be used. A φ-q-n pattern diagram is a diagram obtained by accumulating the φ-q characteristics for a certain time and represents a correlation among the charge amount of partial discharge, the number of occurrences of partial discharge, and the phase of an applied voltage.

Figure 1B:
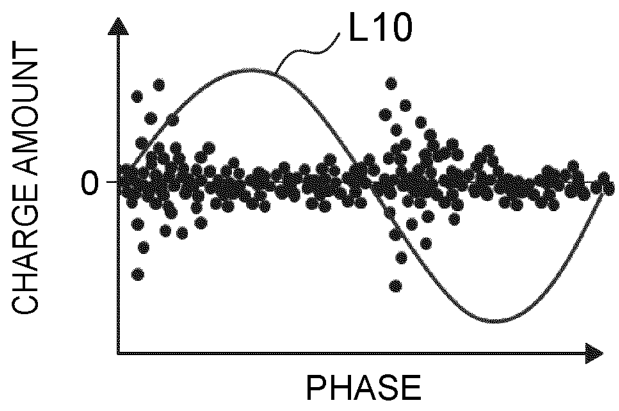
Figure 1C:
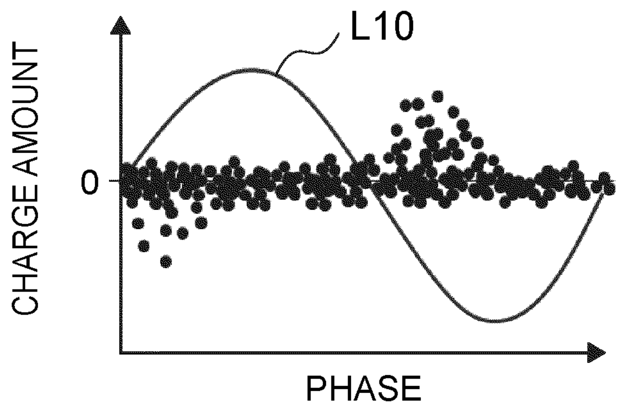

FIGS. 1A to 1C are φ-q pattern diagrams for respective factors of partial discharge. The φ-q pattern diagrams in FIGS. 1A to 1C each represent a relation between a phase φ of an applied voltage L10 and a charge amount q. The vertical axis represents the charge amount, and the horizontal axis represents the phase (time). There are a plurality of factors of insulation deterioration causing generation of a partial-discharge signal in one period of the applied voltage L10. Therefore, the aspects of φ-q pattern diagrams are different between the factors of insulation deterioration. For example, the partial-discharge signal is generated from 180° to 270° in FIG. 1A and is generated from 0° to 90° and 90° to 270° in FIG. 1B. As described later, the partial-discharge signal is measured as a larger charge amount than, for example, an average charge amount.

In FIG. 1C, the partial-discharge signal is generated on the minus side from 0° to 90° and on the plus side from 90° to 270°. Those aspects can be associated with the factors of generation. In the present embodiment, learning data in which the factors of generation are associated can be used when machine learning for determining the insulated condition of an electric device is performed. FIGS. 1A to 1C illustrate an example of the aspects of the φ-q pattern diagrams for respective factors of partial discharge, and a pattern for a factor of partial discharge is not limited thereto.

Pseudo Partial-Discharge Signal

Figure 2A:
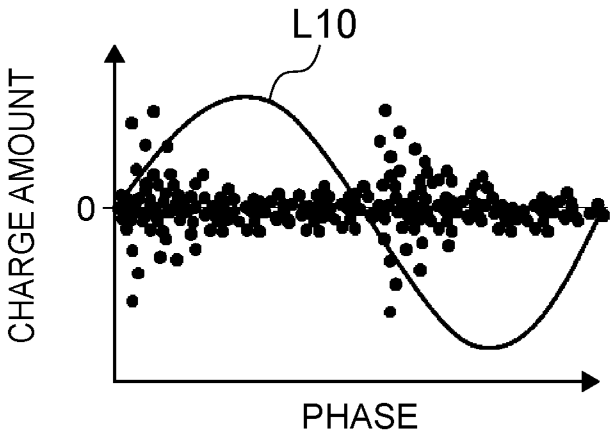
FIGS. 2A and 2B are diagrams illustrating an example of a partial-discharge signal and a pseudo partial-discharge signal.
Figure 2B:
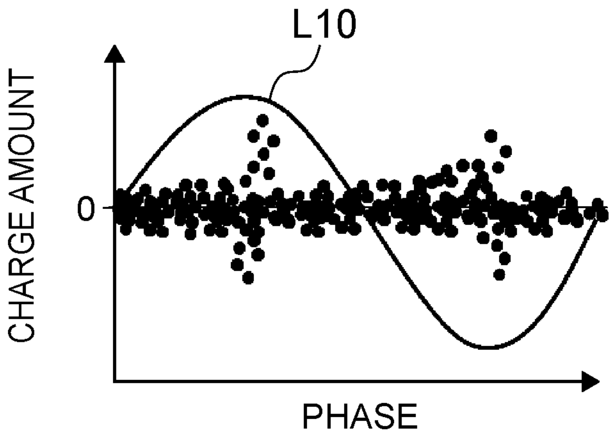

In the present embodiment, an electric signal generated not because of an insulator that is an object of determination may be called a pseudo partial-discharge signal. Possible generation factors of the pseudo partial-discharge signal include a case where a discharge signal generated, for example, in an object not to be measured propagates to a sensor and is measured by the sensor. FIGS. 2A and 2B are φ-q pattern diagrams illustrating an example of pseudo partial-discharge signals. The vertical axis represents the charge amount, and the horizontal axis represents the phase (time). For example, FIG. 2A illustrates an aspect example in which a partial-discharge signal is generated in a range from 0° to 90° and a range from 90° to 270°. Meanwhile, FIG. 2B illustrates an aspect example in which the pseudo partial-discharge signal is generated around 90° and around 270°.

For example, as illustrated in FIGS. 1A to 1C and 2A, in a φ-q pattern diagram, a partial-discharge signal is frequently generated around at least one of a range from 0° to 90° and a range from 180° to 270° of the phase of an applied voltage. Meanwhile, the results of experiments made by the present applicant reveal that the phase at which a pseudo partial-discharge signal is generated statistically tends to be shifted from the phase at which the partial-discharge signal is generated as illustrated in FIG. 2B.

Pseudo Partial-Discharge Signal in Three-Phase AC

Figure 3:
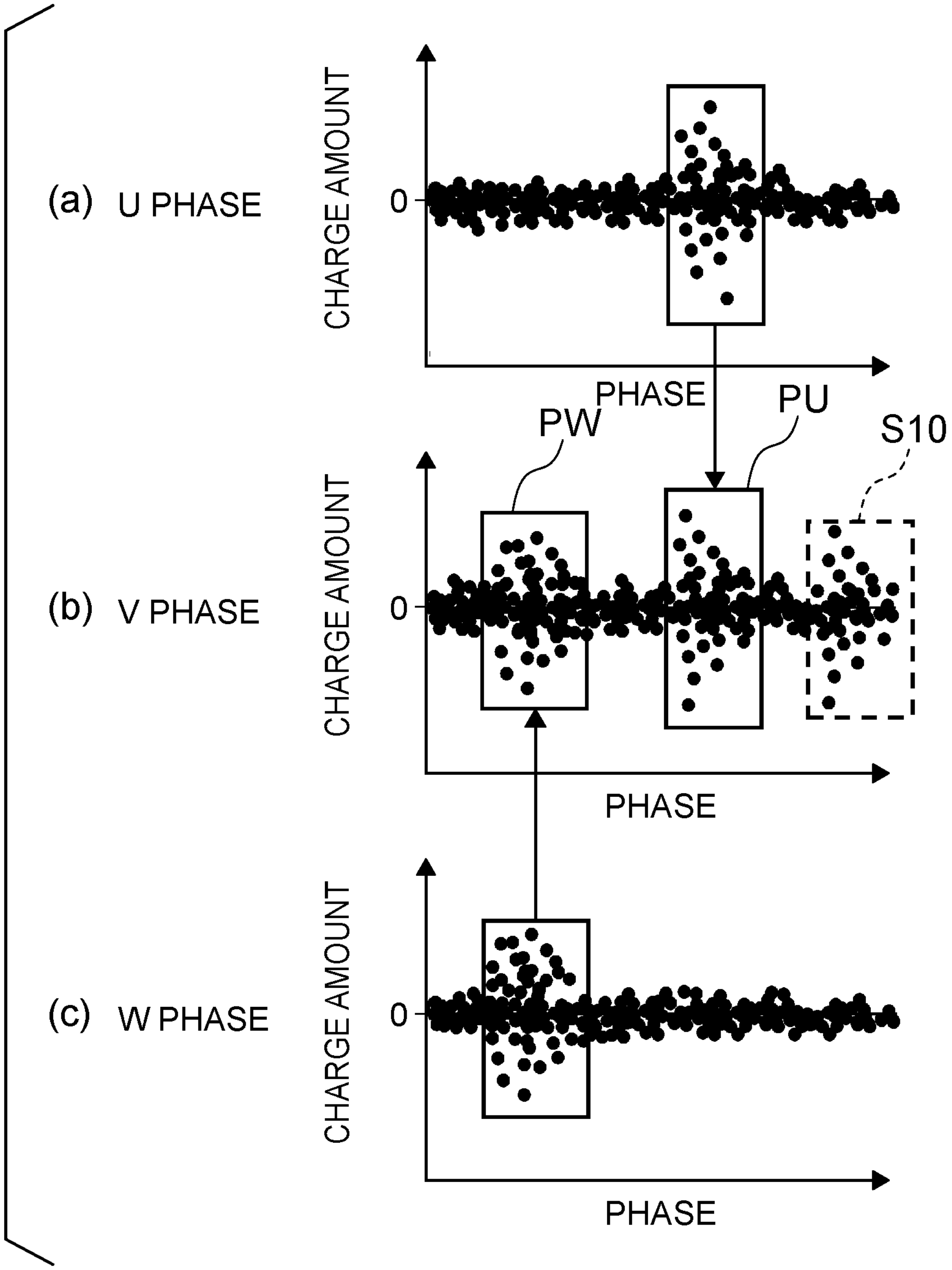
FIG. 3 is a diagram illustrating an example in which partial-discharge signals generated by U-phase and W-phase are superimposed on a partial-discharge signal for V-phase.

The results of experiments made by the present applicant also reveal that signals for U-phase, V-phase, and W-phase may be superimposed in a generator and an electric motor. FIG. 3 is a diagram illustrating an example in which partial-discharge signals generated by U-phase and W-phase are superimposed on a partial-discharge signal for V-phase. The vertical axis represents the charge amount, and the horizontal axis represents the phase (time). FIG. 3(*a*) is a φ-q pattern diagram for U-phase, FIG. 3(*b*) is a φ-q pattern diagram for V-phase, and FIG. 3(*c*) is a φ-q pattern diagram for W-phase. In this example, the partial-discharge signals for U-phase and W-phase are superimposed as pseudo partial-discharge signals PU and PW on a partial-discharge signal S10 for V-phase.

Configuration of Partial-Discharge Diagnostic System

Figure 4:
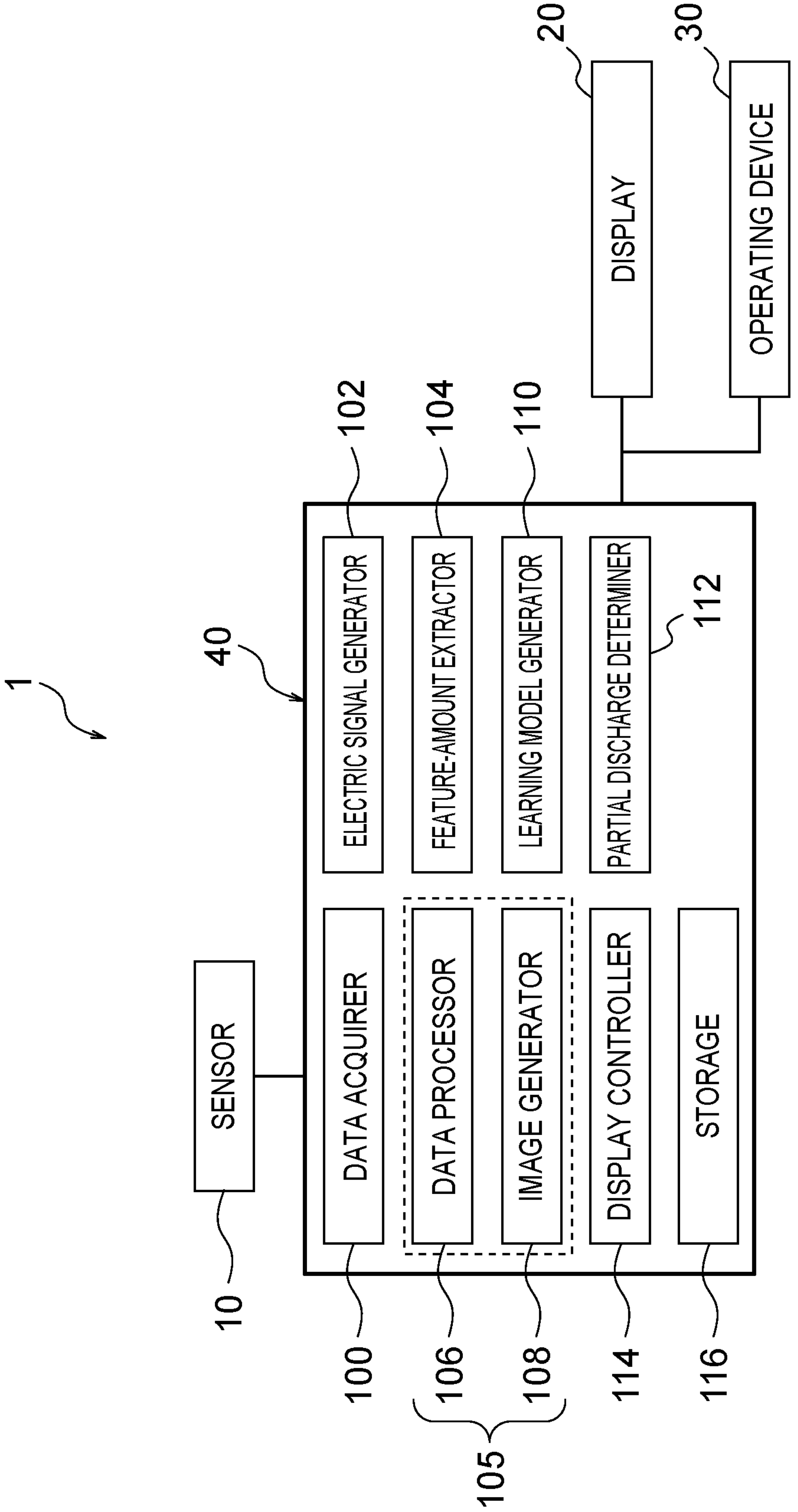
FIG. 4 is a block diagram illustrating a configuration example of a partial-discharge diagnostic system.

Next, a system configuration of a partial-discharge diagnostic system 1 is described. FIG. 4 is a block diagram illustrating a configuration example of the partial-discharge diagnostic system 1. As illustrated in FIG. 4, the partial-discharge diagnostic system 1 is a system that can reduce the influence of a pseudo partial-discharge signal and can perform at least either determination of the presence or absence of partial discharge or determination of a factor of partial discharge. The partial-discharge diagnostic system 1 includes a measuring instrument 10, a display 20, an operating device 30, and a partial-discharge diagnostic processing device 40.

The measuring instrument 10 supplies time-series data of a measured electric signal from a sensor attached to an electric device to the partial-discharge diagnostic processing device 40. Examples of the sensor include a high-frequency current sensor of current system and an electromagnetic wave antenna of electromagnetic wave system. As described above, the electric signal includes at least any of a charge amount signal, a current signal, and a voltage signal.

The display 20 is a monitor, for example. The display 20 displays image data supplied from the partial-discharge diagnostic processing device 40.

The operating device 30 is configured by an input device such as a keyboard and a mouse. The operating device 30 inputs a signal based on an operation by an operator to the partial-discharge diagnostic processing device 40.

As illustrated in FIG. 4, the partial-discharge diagnostic processing device 40 is a device that can perform diagnosis of partial discharge while reducing the influence of a pseudo partial-discharge signal. The partial-discharge diagnostic processing device 40 includes a data acquirer 100, an electric signal generator 102, a feature-amount extractor 104, a processor 105, a learning model generator 110, a partial discharge determiner 112, a display controller 114, and a storage 116. The processor 105 includes a data processor 106 and an image generator 108.

The partial-discharge diagnostic processing device 40 includes a CPU (Central Processing Unit) and is a computer, for example. The partial-discharge diagnostic processing device 40 executes a program stored in the storage 116, thereby being able to configure the data acquirer 100, the electric signal generator 102, the feature-amount extractor 104, the processor 105, the learning model generator 110, and the partial discharge determiner 112. The data acquirer 100, the electric signal generator 102, the feature-amount extractor 104, the data processor 106, the image generator 108, the learning model generator 110, and the partial discharge determiner 112 can be configured by electronic circuits.

The data acquirer 100 acquires time-series data of an electric signal measured by a sensor attached to an electric device from the measuring instrument 10. The measuring instrument 10 includes a plurality of sensors. The data acquirer 100 can acquire time-series data of a plurality of different electric signals from the measuring instrument 10. The number of the measuring instruments 10 is not limited to one and a plurality of measuring instruments 10 can be used.

The electric signal generator 102 acquires or generates a learning electric signal (simulated electric signal) used for machine learning. The electric signal generator 102 generates a simulated electric signal having, for example, partial-discharge signal data. The electric signal generator 102 generates simulated electric signals having, for example, partial-discharge signals illustrated in the φ-q pattern diagrams in FIGS. 1A to 1C. The electric signal generator 102 can also generate a simulated electric signal not having a partial-discharge signal.

The electric signal generator 102 acquires a simulated electric signal simulating a generation factor of partial discharge, for example, in a tester that reproduces the whole or part of the electric device, via the data acquirer 100. The electric signal generator 102 can also generate data by adding pseudo partial-discharge signal data to data including partial-discharge signal data. These sets of data are stored in the storage 116 in association with respective generation factors.

The electric signal generator 102 may use simulation as the method of generating the simulated electric signal. Alternatively, the electric signal generator 102 may combine the simulated electric signal acquired by the tester and data generated by simulation together. Such a configuration can increase the data amount with regard to a partial-discharge signal for each factor, so that the accuracy of determination by machine learning can be more improved. The simulated electric signal generated by the electric signal generator 102 is a signal indicating the charge amount, a voltage, a current, or the like with respect to a phase (time), similarly to the electric signal acquired by the data acquirer 100.

The feature-amount extractor 104 extracts, for each generation factor of a partial-discharge signal, a feature indicating generation of the partial-discharge signal from the simulated electric signal generated by the electric signal generator 102. The feature-amount extractor 104 extracts the feature indicating generation of the partial-discharge signal, for example, from the magnitude or the frequency of the electric signal and generates information on the range in which the partial-discharge signal is generated, such as the phase range, the frequency range, and the magnitude range of the partial-discharge signal, as a feature amount. That is, the feature amount means information on the range in which the partial-discharge signal is generated, for example, the phase range, the frequency range, or the magnitude range of the partial-discharge signal. Use of the simulated electric signal makes it possible to effectively extract a feature amount related to a partial-discharge signal for each generation factor which is less influenced by noise such as a pseudo partial-discharge signal. The feature-amount extractor 104 will be described in detail later.

The data processor 106 performs preprocessing on the electric signal acquired by the data acquirer 100 and the simulated electric signal generated by the electric signal generator 102. The data processor 106 also performs a process of reducing the pseudo partial-discharge signal based on information related to the partial-discharge signal generated by the feature-amount extractor 104. For example, the data processor 106 can reduce an electric signal in a range in which it is highly likely that no partial-discharge signal is present. In the present embodiment, "reduce" includes "delete". Details of the data processor 106 will also be described later.

The image generator 108 can generate data in a predetermined format by using data processed by the data processor 106 or data before being processed by the data processor 106. For example, the image generator 108 generates data in a predetermined format as image data having numerical values arranged two-dimensionally. As described above, the processor 105 including the data processor 106 and the image generator 108 performs a process of generating the data in a predetermined format in which the pseudo partial-discharge signal has been reduced in the electric signal varying with the phase.

More specifically, the image generator 108 can generate a grayscale image or a color image. In the present embodiment, although data used in machine learning or determination may be arranged in a two-dimensional matrix, the data arrangement is not limited thereto. The data for learning or data for determination arranged in a two-dimensional matrix may be called image data. That is, the data for learning or the data for determination that includes data arranged in a two-dimensional matrix and can be converted to an image may be called image data. By causing the display 20 to display such image data, it is possible to allow a feature of the data for learning or data for determination to be recognized visually.

The learning model generator 110 generates a learning model (a discriminator) by using the data processed by the data processor 106 as learning data. The learning model generator 110 can also generate a learning model by using the image data that includes data arranged in a two-dimensional matrix and can be converted to an image, generated by the image generator 108, as learning data. The learning model generator 110 associates a generation factor of partial discharge, the presence or absence of generation of partial discharge, and the like as a teaching signal with the data processed by the data processor 106, thereby obtaining learning data. Machine learning by the learning model generator 110 can use a neural network or another discrimination learning algorithm, and the learning algorithm is not limited. As described above, the learning model generator 110 generates a learning model by using learning data in which at least either a factor of partial discharge or the presence or absence of partial discharge is associated with data generated by the processor 105.

The partial discharge determiner 112 performs determination of the presence or absence of a partial-discharge signal and the factor thereof in an electric signal (data for determination) that is an object of diagnosis by using the learning model generated by the learning model generator 110, for example, on the result of the process by the data processor 106. The display controller 114 can cause the display 20 to display two-dimensional data generated by the image generator 108.

The storage 116 is configured by an HDD (hard disk drive), an SSD (solid state drive), or the like. The storage 116 stores therein various types of data and programs to be used by the partial-discharge diagnostic processing device 40. For example, the storage 116 stores therein data acquired by the data acquirer 100, data for learning, data for determination, and data related to a learning model which has been learned.

Figure 5:
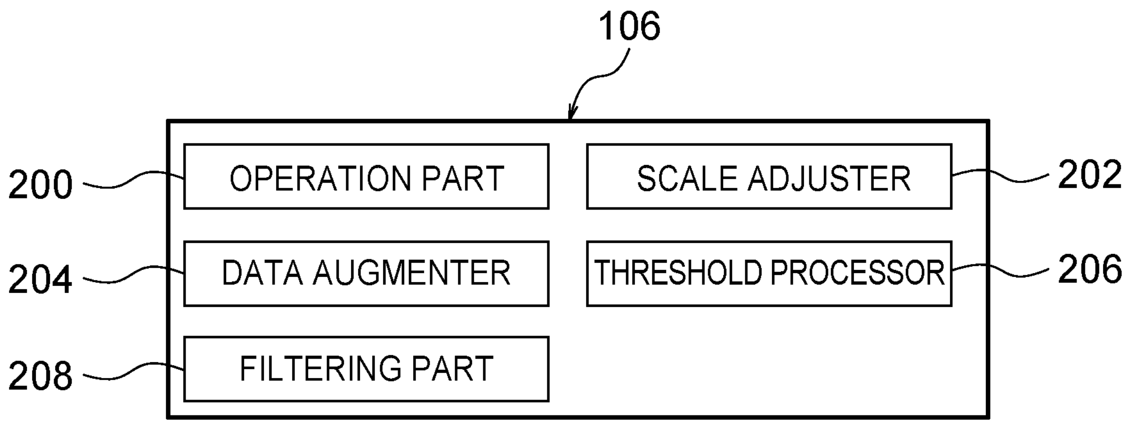
FIG. 5 is a block diagram illustrating a configuration example of a data processor.

Details of the data processor 106 are described here. FIG. 5 is a block diagram illustrating a configuration example of the data processor 106. As illustrated in FIG. 5, the data processor 106 includes an operation part 200, a scale adjuster 202, a data augmenter 204, a threshold processor 206, and a filtering part 208. The operation part 200 performs an arithmetic process such as a statistical process, fast Fourier transformation, wavelet transform, linear transformation, nonlinear transformation such as logarithmic transformation, standardization, normalization, canonicalization, and averaging, on an electric signal acquired by the data acquirer 100 and a simulated electric signal generated by the electric signal generator 102. Alternatively, the operation part 200 can perform one of these processes or an arithmetic process that is a combination of a plurality of these processes.

The operation part 200 can output a φ-q pattern diagram, a φ-q-n pattern diagram, a spectrogram, and a scalogram as the result of the arithmetic process, for example. A generation example of a φ-q-n pattern diagram by the operation part 200 is described here with reference to FIGS. 6A, 6B, and 7.

Figure 6A:
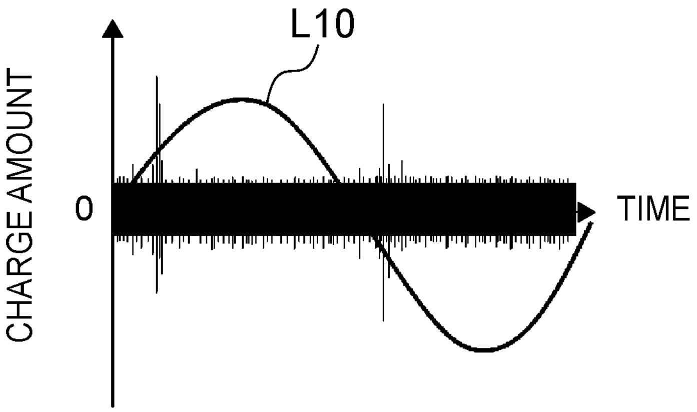
FIGS. 6A and 6B are diagrams illustrating an example of a method of generating a φ-q pattern diagram by an operation part.
Figure 6B:
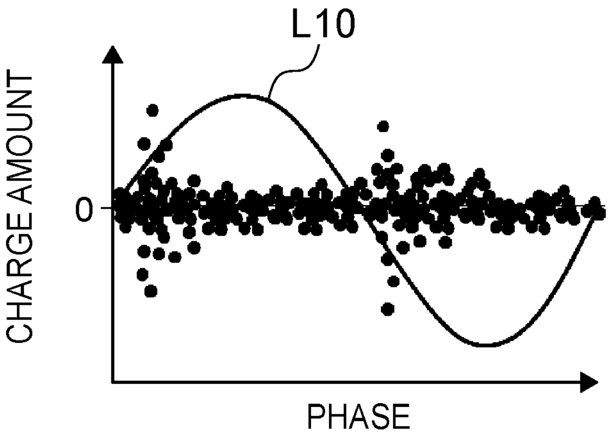

FIGS. 6A, 6B are diagrams illustrating an example of a method of generating a φ-q pattern diagram by the operation part 200. FIG. 6A illustrates a time-series electric signal acquired by the data acquirer 100. The vertical axis represents the charge amount, and the horizontal axis represents the phase (time) from 0 degrees to 360 degrees in one period section of an applied voltage. FIG. 6B is a diagram illustrating data in FIG. 6A as a discrete value for each of sections obtained by dividing the one period section. Time-series data may be data for one period or for multiple periods. That is, the number of times of superimposing the time-series data can be set to any number. The operation part 200 can generate a φ-q pattern diagram on which the charge amount is plotted with respect to the phase of the applied voltage in this manner.

Figure 7:
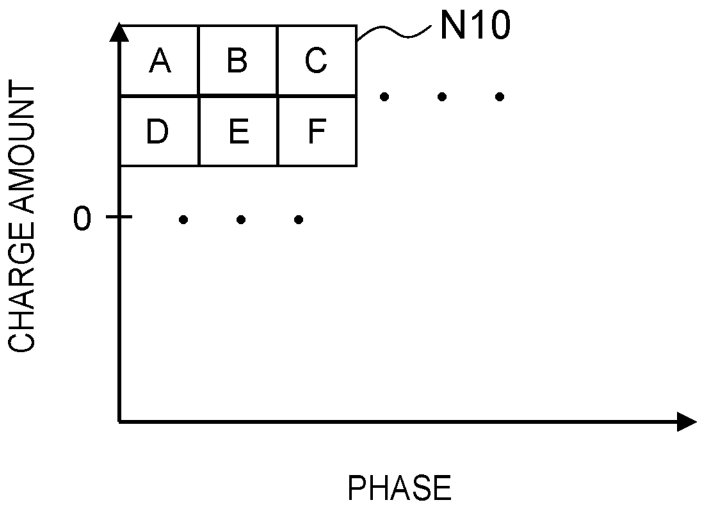
FIG. 7 is a diagram illustrating an example of a method of generating a φ-q-n pattern diagram by the operation part.

FIG. 7 is a diagram illustrating an example of a method of generating a φ-q-n pattern diagram by the operation part 200. The vertical axis represents the charge amount, and the horizontal axis represents the phase (time) from 0 degrees to 360 degrees in one period section of an applied voltage. A φ-q-n pattern diagram is obtained by setting a desired number of sections N10 with respect to the charge amount on the vertical axis and the phase on the horizontal axis on the φ-q pattern diagram in FIG. 6B, and accumulating the number of occurrences of charges generated in each section N10 to obtain an occurrence frequency, for example, indicated by A to F, and is represented as a two-dimensional histogram. Accumulation of the number of occurrences of charges may be performed for an electric signal for one period or an electric signal for multiple periods.

Figure 8:
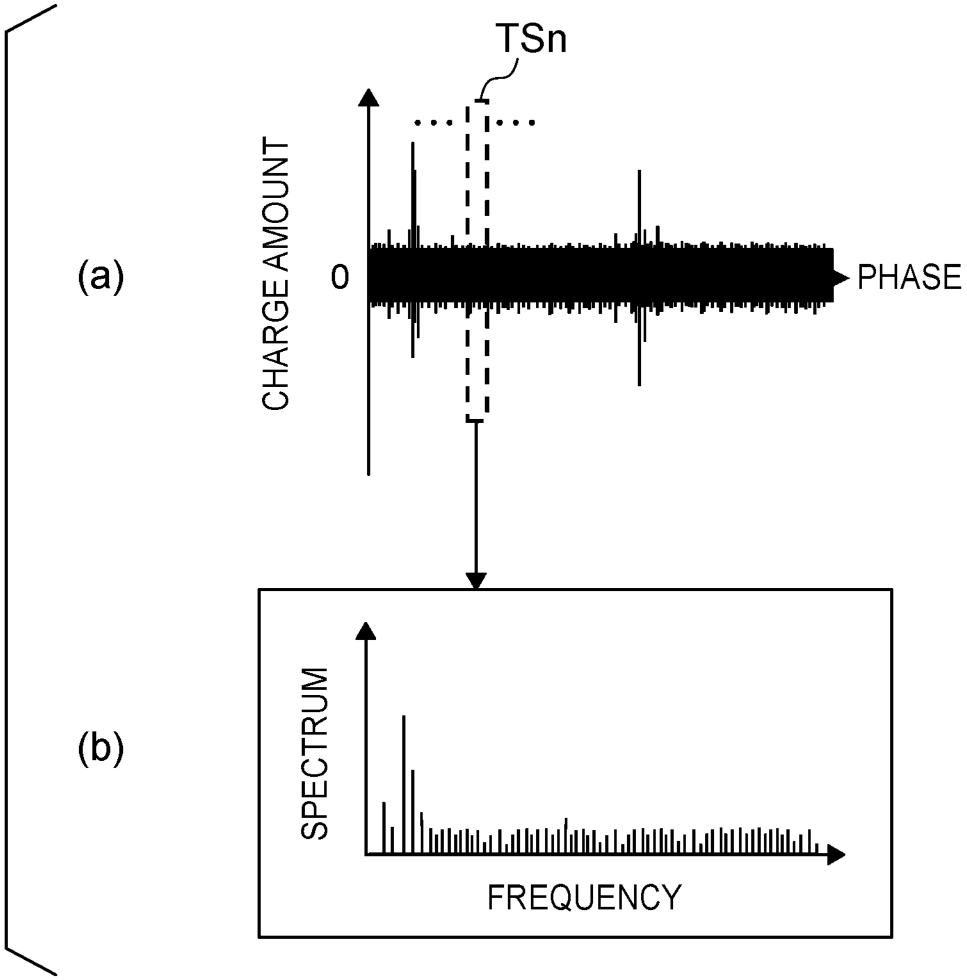
FIG. 8 is a diagram illustrating an example in which fast Fourier transformation is performed on time-series data of an electric signal for a time section.

A generation example of a spectrogram by the operation part 200 is described here with reference to FIGS. 8(*a*), 8(*b*), 9(*a*), and 9(*b*). FIG. 8 is a diagram illustrating an example in which fast Fourier transformation (FFT) is performed on time-series data of an electric signal for a desired time section. FIG. 8(*a*) is a diagram illustrating an example of converting time-series data of an electric signal to a frequency spectrum. The vertical axis represents the charge amount, and the horizontal axis represents the phase (time) from 0 degrees to 360 degrees in one period section of an applied voltage. FIG. 8(*b*) is a diagram illustrating a spectrum in one section TSn. The vertical axis represents the spectrum, and the horizontal axis represents the frequency.

As illustrated in FIG. 8(*a*), the operation part 200 divides the range of phase into n time sections TS1 to TSn, where n can be set to a desired number. The operation part 200 performs fast Fourier transformation on time-series data of an electric signal for each of the time sections TS1 to TSn corresponding to the phases. That is, the spectral component corresponding to the charge amount in FIG. 8(*b*) indicates each frequency component value obtained by fast Fourier transformation performed on the time-series data of the electric signal for one section.

Figure 9:
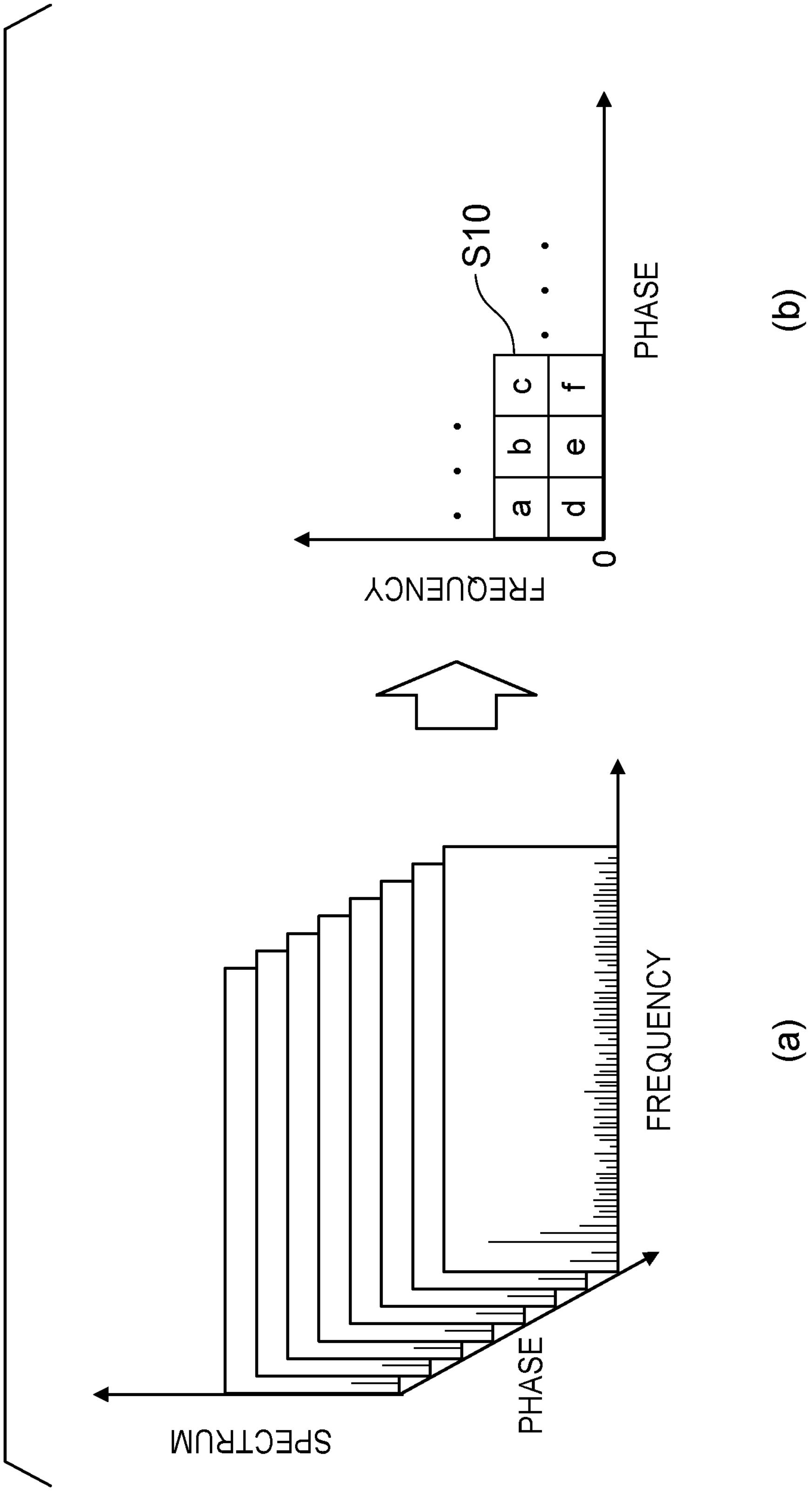
FIG. 9 is a diagram illustrating an example of generation of a spectrogram by the operation part.

FIG. 9 is a diagram illustrating an example of generation of a spectrogram by the operation part 200. FIG. 9(*a*) is a diagram schematically illustrating a spectral diagram for each of the time sections TS1 to TSn corresponding to phases corresponding to those in FIG. 8(*b*). FIG. 9(*b*) is a diagram obtained by dividing the phase in FIG. 9(*a*) into a plurality of sections and representing spectral values in respective sections S10 as a two-dimensional histogram. The horizontal axis represents the phase, and the vertical axis represents the frequency. Numerical values a to f in the respective sections represent spectral values in the respective sections S10. As described above, a spectrogram is obtained by performing fast Fourier transformation on time-series data of an electric signal for a desired time section and representing a spectral component corresponding to the charge amount in a two-dimensional matrix in which the vertical axis represents the frequency and the horizontal axis represents the phase with respect to an applied voltage.

In generation of a scalogram by the operation part 200, wavelet transform is performed on time-series data of an electric signal in place of fast Fourier transformation. That is, the generated scalogram is a representation of generation frequencies of frequency components obtained by wavelet transform in a two-dimensional histogram. As described above, a scalogram is obtained by performing wavelet transform on time-series data of an electric signal for a desired time section and representing a frequency component corresponding to the charge amount in a two-dimensional matrix in which the vertical axis represents the frequency and the horizontal axis represents the phase with respect to an applied voltage.

Figure 10:
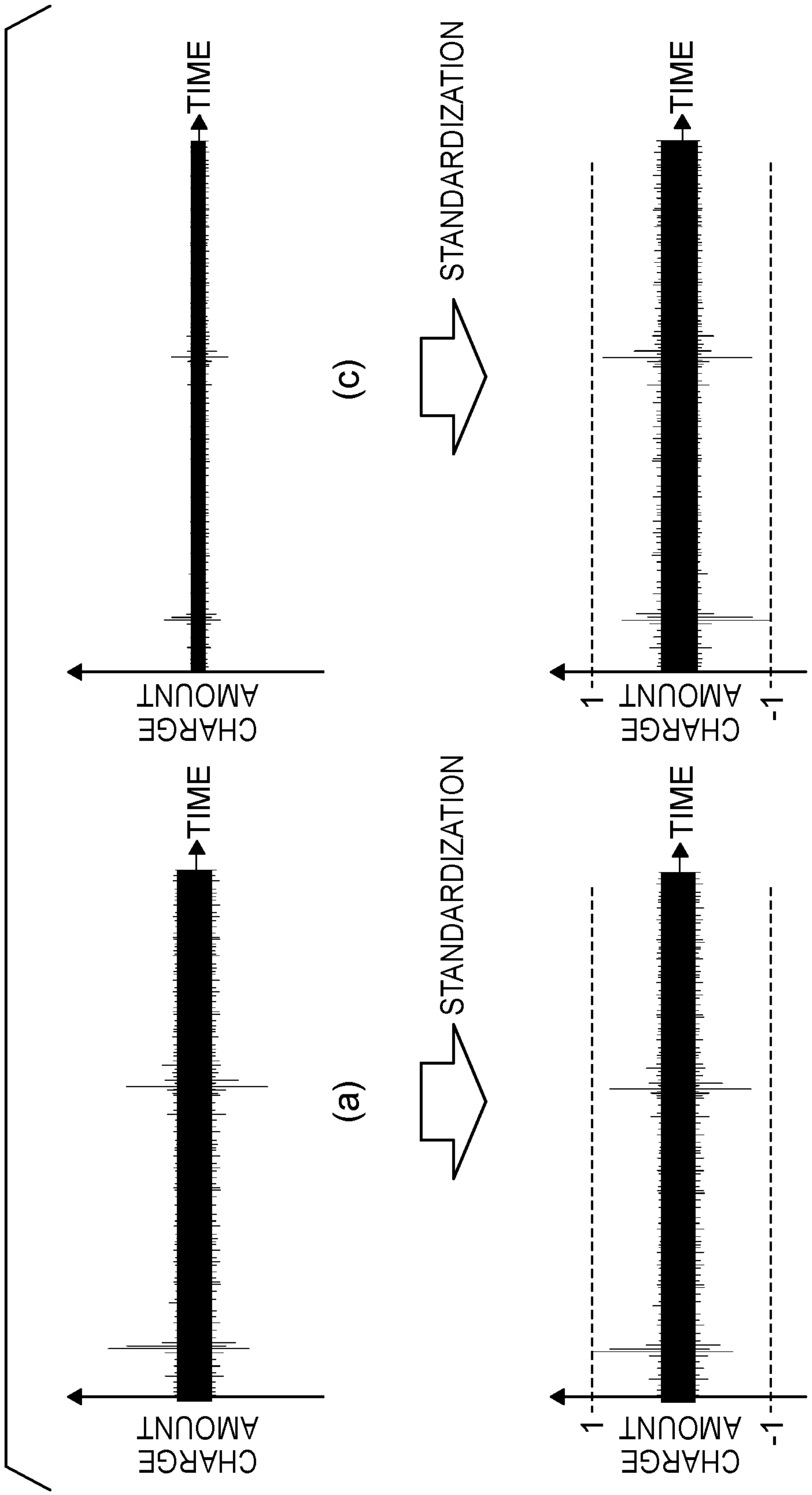
FIG. 10 is a diagram illustrating an example of standardization on the time-series data of an electric signal.

The scale adjuster 202 can perform scale conversion on time-series data of an electric signal as the result of an arithmetic process. FIG. 10 is a diagram illustrating an example of standardization on time-series data of an electric signal. The horizontal axis represents the time corresponding to the phase, and the vertical axis represents the charge amount. FIGS. 10(*a*) and 10(*c*) illustrate data before standardization, and FIGS. 10B and 10D illustrate standardized data.

As illustrated in FIG. 10, the scale adjuster 202 converts a value of the time-series data of the electric signal in such a manner that a reference value measured in a desired time range is a predetermined value. For example, the predetermined value is assumed as 1. By standardization by the scale adjuster 202 described above, even when the scale (the range of signal intensity) is different between the signal intensity of an electric signal of an actual machine acquired by the data acquirer and the signal intensity of a simulated electric signal generated by the electric signal generator 102, the scales of them can be made coincident with each other. With this standardization, it is possible to reduce the influence in a case where the maximum value and the minimum value are not determined and a case where an outlier generated statistically suddenly is present. Accordingly, it is possible to prevent decrease in the accuracy of determination by a learning model even when the signal intensity of the simulated electric signal generated by the electric signal generator 102 and the signal intensity of the electric signal acquired from the actual machine are different from each other.

The refence value in standardization may be any value. For example, it is possible to make scaling more stable by setting the maximum value in one period of an applied voltage or the maximum value in multiple periods to the reference value. Although standardization has been performed on the charge amount of time-series data in FIGS. 10(*a*) to 10(*d*) as an example, the present embodiment is not limited thereto. The scale adjuster 202 may perform standardization on another data. The scale adjuster 202 may use normalization that makes the ranges of the minimum value and the maximum value predetermined ranges, in place of standardization.

The scale adjuster 202 can also perform scale conversion on two-dimensional matrix data such as a φ-q-n pattern diagram, a spectrogram, and a scalogram. The scale adjuster 202 can perform linear transformation, logarithmic transformation, sigmoid transform, binarization, standardization, normalization, and canonicalization as scale conversion, for example.

Figure 11:
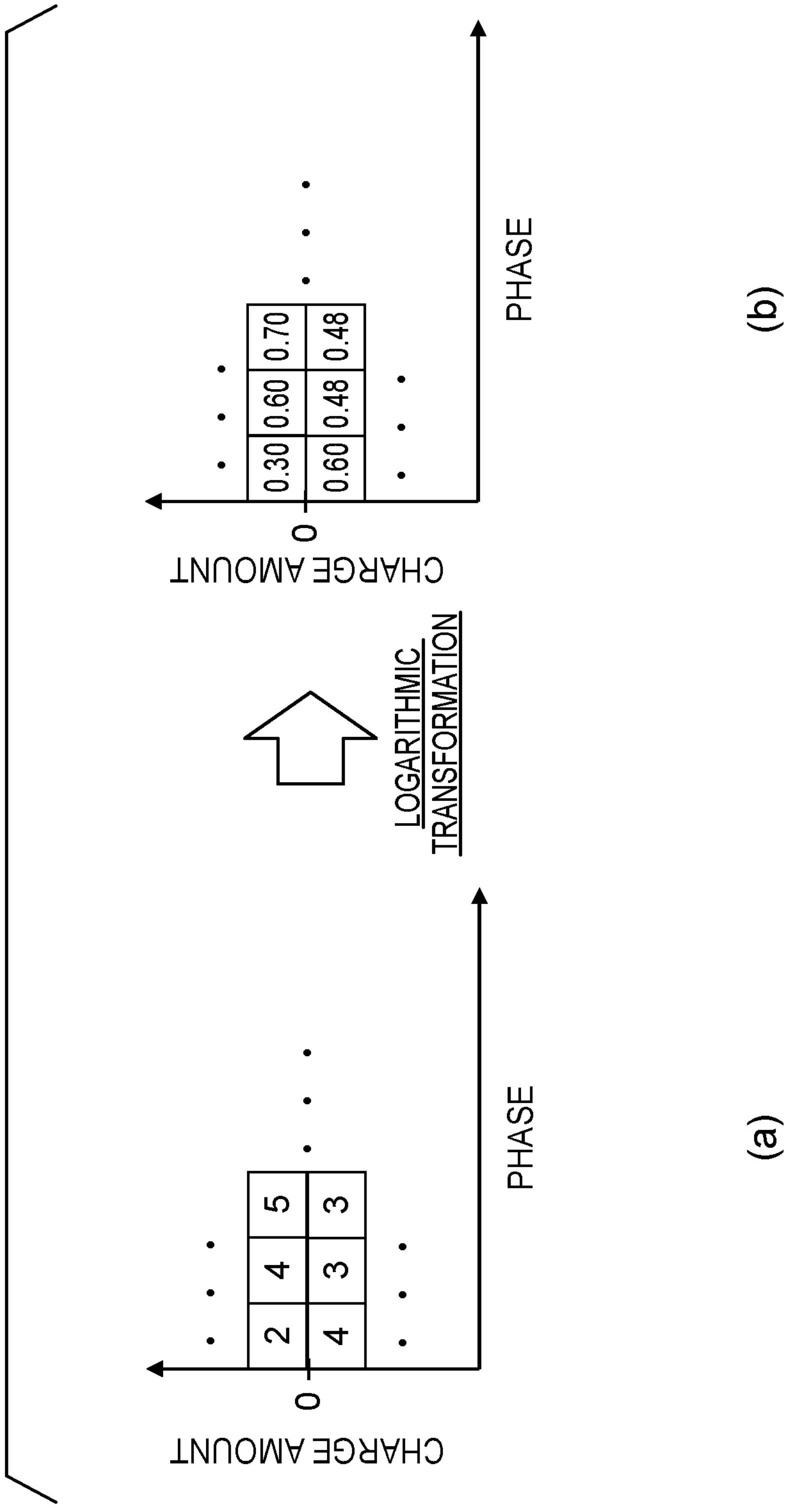
FIG. 11 is a diagram illustrating an example in which logarithmic transformation is performed on a two-dimensional matrix of a φ-q-n pattern diagram.

FIG. 11 is a diagram illustrating an example in which logarithmic transformation is performed on a two-dimensional matrix of a φ-q-n pattern diagram as scale conversion. FIG. 11(*a*) illustrates the state before conversion, and FIG. 11(*b*) illustrates the state after conversion. The horizontal axis represents the phase, and the vertical axis represents the charge amount. By performing scale conversion using logarithmic transformation as described above, it is possible to enhance an electric signal by partial discharge in which the charge occurrence frequency is less than that in a normal discharge waveform. Although the scale adjuster 202 uses 10 as the base of logarithm in logarithmic transformation in FIGS. 11(*a*) and 11(*b*), the present embodiment is not limited thereto. The scale adjuster 202 may use another base such as the Napier's constant.

The data augmenter 204 performs a data increasing process. For example, the data amounts for respective factors of partial discharge may be unbalanced in acquired data. In this case, the learning model generator 110 tends to perform learning by emphasizing a factor of having the large data amount when constructing a learning model, and therefore there is a risk that a decrease in the determination accuracy is caused with regard to an event that occurs less frequently.

For this reason, the data augmenter 204 performs the data increasing process on such data to reduce a statistical imbalance in learning data. With such a process, it is possible to generate learning data that is not statistically unbalanced when a learning model is constructed, so that the accuracy of factor determination can be improved. Similarly, the data augmenter 204 can reduce time and effort to acquire data by a test or a simulation by performing the increasing process on a simulated electric signal. As described above, the data augmenter 204 can make the numbers of pieces of learning data for respective generation factors uniform.

That is, the data augmenter 204 adds random noise to and/or performs data scale conversion on, for example, at least one of an electric signal (simulated electric signal) generated by the electric signal generator 102 and an electric signal acquired via the data acquirer 100 from a simulator or the like, as the method of the data increasing process. The data augmenter 204 can also perform a data increasing process by combining these data pieces with each other. For example, the data augmenter 204 can perform an increasing processing method using averaging (or addition) on at least one of the generated electric signal and the acquired electric signal.

Figure 12:
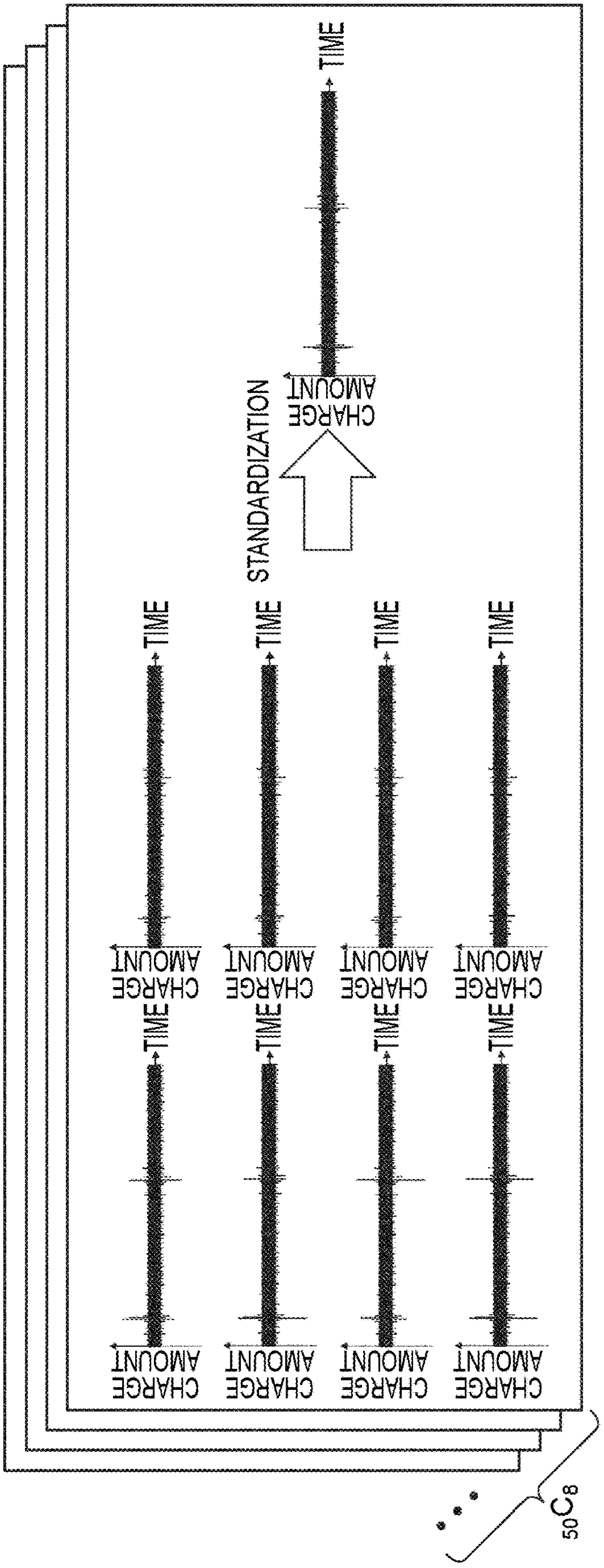
FIG. 12 is an explanatory diagram of an increasing processing method using averaging.

The increasing processing method using averaging by the data augmenter 204 is described in more detail with reference to FIG. 12. FIG. 12 is an explanatory diagram of the increasing processing method using averaging. As illustrated in FIG. 12, the data augmenter 204 acquires data including 50 data pieces from an electric signal (that can include a simulated electric signal) for one partial discharge factor and extracts 8 data pieces from the 50 data pieces. The data augmenter 204 then averages the charge amounts at respective times of the extracted eight data pieces, thereby generating an electric signal that is different from the original data in the charge amount. With this method, the number of data pieces can be increased by the number of combinations of data pieces to be averaged ($_{50}C_8$).

FIG. 12 illustrates a combination of 8 data pieces selected from 50 data pieces as an example, and the present embodiment is not limited thereto. For example, the number of data pieces as the original data and the number of extracted data pieces can be set to any numbers. For example, the number of extracted data pieces n may be set in such a manner that the number of combinations of the n data pieces extracted from m data pieces ($_mC_n$) becomes the maximum, or may be set considering the computation cost. Further, the increasing process may be called an augmentation process.

Furthermore, data pieces may be further extracted at random from the increased mCn data pieces. With this extraction, it is possible to make the numbers of data pieces for respective partial discharge factors uniform. Accordingly, in a case where such data is used as learning data, the time required for learning can be adjusted while the numbers of data pieces are kept uniform.

In addition, another possible increasing processing method is to add data directly acquired from an electric device that is an object of diagnosis to an electric signal for learning. In particular, data is generated by combining electric signals acquired while the electric device as the object of diagnosis is stopped. Since random noise generated by the electric device is reduced while the electric device is stopped, it is possible to generate learning data with noise reduced while reducing a statistical imbalance in the learning data. The data increasing process described above may be performed not only on time-series data but also on two-dimensional matrix data obtained by conversion, such as a φ-q-n pattern diagram, a spectrogram, and a scalogram.

The threshold processor 206 performs setting of a threshold. The threshold processor 206 can also perform a preliminary determination process using the threshold. For example, the threshold processor 206 can determine the presence or absence of a partial-discharge signal from a threshold with respect to the maximum discharge charge amount. More specifically, the threshold processor 206 determines that a partial-discharge signal is present, when the number of times of the discharge charge amount exceeding the threshold per second exceeds a predetermined value. For example, classification of partial discharge factors using a learning model (discriminator) by machine learning may be performed, when the threshold processor 206 determines that the partial-discharge signal is present. As described above, the partial discharge determiner 112 can also perform determination of the presence or absence of partial discharge, factor determination, and the like by using the threshold processor 206 and a learning model.

The filtering part 208 generates a characteristic range from data used for learning or determination as learning data or determination data, by using information related to a partial-discharge signal extracted by the feature-amount extractor 104. For example, the filtering part 208 can perform a filtering process such as bandpass filtering, a window function, and a masking process on an electric signal. The filtering part 208 can also perform an adjustment process that makes reference points of phases of electric signals or the like coincident with each other.

Figure 13:
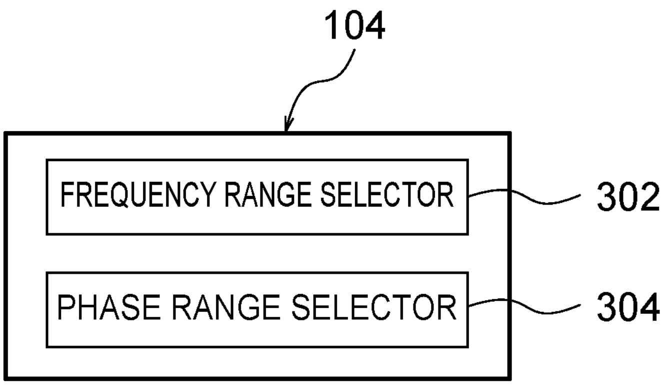
FIG. 13 is a block diagram illustrating a configuration example of a feature-amount extractor.

Details of the feature-amount extractor 104 are described here. FIG. 13 is a block diagram illustrating a configuration example of the feature-amount extractor 104. As illustrated in FIG. 13, the feature-amount extractor 104 includes a frequency range selector 302 and a phase range selector 304.

The frequency range selector 302 extracts a frequency-related feature of a partial-discharge signal based on, for example, an electric signal (that can include a simulated electric signal) generated or acquired by the electric signal generator 102. The frequency range selector 302 extracts the frequency-related feature of the partial-discharge signal for each generation factor by using an electric signal for that generation factor.

Figure 14A:
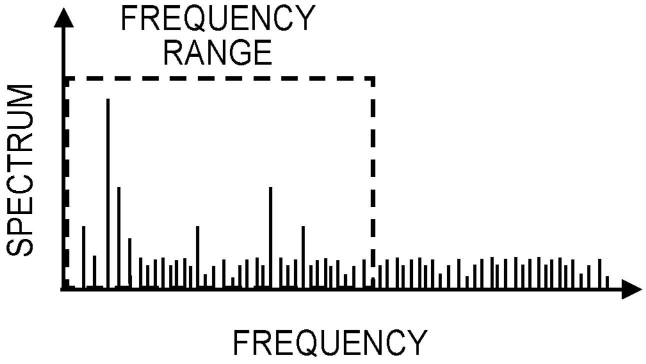
FIGS. 14A and 14B are diagrams illustrating an example of frequency spectra generated by fast Fourier transformation performed on pseudo electric signals.
Figure 14B:
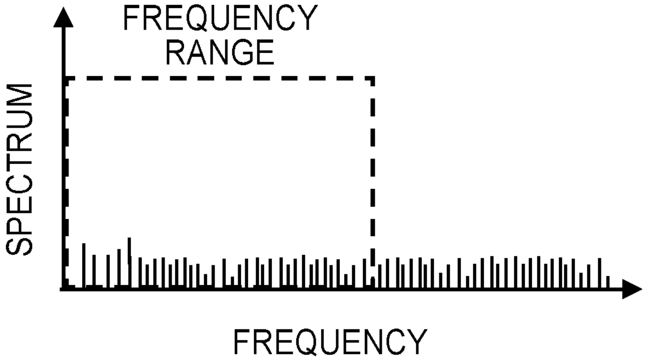

FIGS. 14A and 14B are diagrams illustrating an example of frequency spectra generated by fast Fourier transformation performed on electric signals. The horizontal axis represents the frequency, and the vertical axis represents the spectrum. FIG. 14A illustrates the spectrum for a simulated electric signal when partial discharge has occurred, and FIG. 14B illustrates the spectrum for an electric signal when partial discharge has not occurred.

When FIG. 14A and FIG. 14B are compared with each other, there is a range in which the spectral value of the simulated electric signal with partial discharge is larger than the simulated electric signal with no partial discharge. The frequency range selector 302 generates, for example, a frequency range in which the spectral value exceeds a predetermined threshold as a feature. The frequency range selector 302 automatically sets the frequency range in accordance with, for example, the spectral magnitude or the occurrence frequency. Alternatively, the frequency range selector 302 may generate a frequency range confirmed by a person and determined via the operating device 30 as a feature. The frequency range may be one region or a plurality of regions. Fast Fourier transformation may be performed for an electric signal for one period or an electric signal for multiple periods. Alternatively, fast Fourier transformation may be performed on a region obtained by dividing an electric signal into a desired length.

Figure 15:
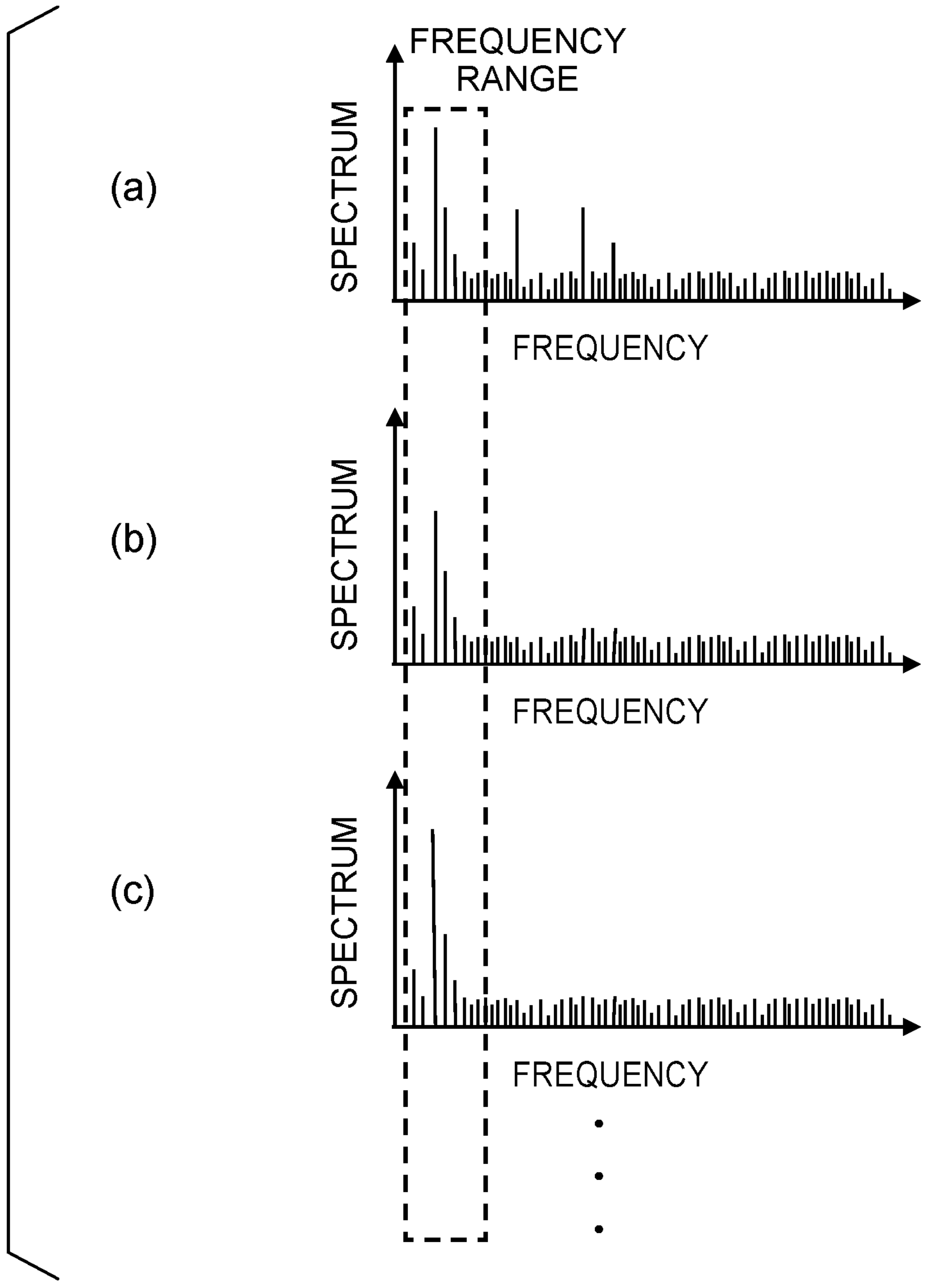
FIG. 15 is a diagram illustrating an example of setting a frequency range from spectral values of pseudo electric signals.

FIG. 15 is a diagram illustrating an example of setting a frequency range from spectral values of a plurality of electric signals with partial discharge. The horizontal axis represents the frequency, and the vertical axis represents the spectrum. FIGS. 15(*a*) to 15(*c*) each illustrates a simulated electric signal with partial discharge. The frequency range selector 302 can also select a frequency range characteristic to partial-discharge signals from frequency spectra as illustrated in FIGS. 15(*a*) to 15(*c*), for example. In this selection, the frequency range selector 302 selects the widest range among frequency ranges respectively determined for frequency spectra as the frequency range of the partial-discharge signal. With this selection, it is possible to reduce the influence of noise generated singly during acquisition of an electric signal in a test.

In this selection, the frequency range selector 302 may select typical data from a plurality of electric signals without partial discharge, as an electric signal without partial discharge that is to be subjected to comparison. Alternatively, the frequency range selector 302 may use data obtained by performing averaging on frequency spectra of the electric signals without partial discharge, as the electric signal without partial discharge that is to be subjected to comparison.

Figure 16:
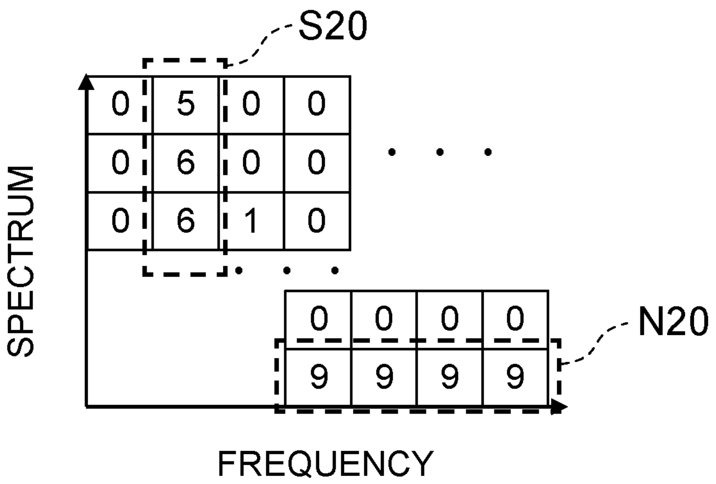
FIG. 16 is a diagram illustrating an example of selecting a frequency range based on the spectral magnitude and the number of occurrences.

FIG. 16 is a diagram illustrating an example in which the frequency range selector 302 selects a frequency range by using a two-dimensional histogram. The horizontal axis represents the frequency, and the vertical axis represents the spectrum. The figure in each small section represents a generation frequency of a spectral component satisfying the condition in the section. That is, FIG. 16 is a two-dimensional histogram obtained by accumulating the number of occurrences with regard to the frequency and the spectral component of each data piece in FIGS. 15(*a*) to 15(*c*). The frequency range selector 302 selects a frequency range by using this two-dimensional histogram based on the spectral magnitude and the number of occurrences. For example, the frequency range selector 302 selects frequencies in a section in which the spectral component exceeds a predetermined value and the generation frequency also exceeds a predetermined value, as a frequency range S20. Meanwhile, the frequency range selector 302 does not select a frequency range N20 because the spectral component in that range does not exceed the predetermined value although the generation frequency exceeds the predetermined value.

The frequency range selector 302 may perform extraction of a frequency-related feature of a partial-discharge signal for a spectrogram and a scalogram or may combine them. For example, when combining them, the frequency range selector 302 selects the widest range among frequency ranges determined for respective types of two-dimensional data as the frequency range of the partial-discharge signal.

Figure 17:
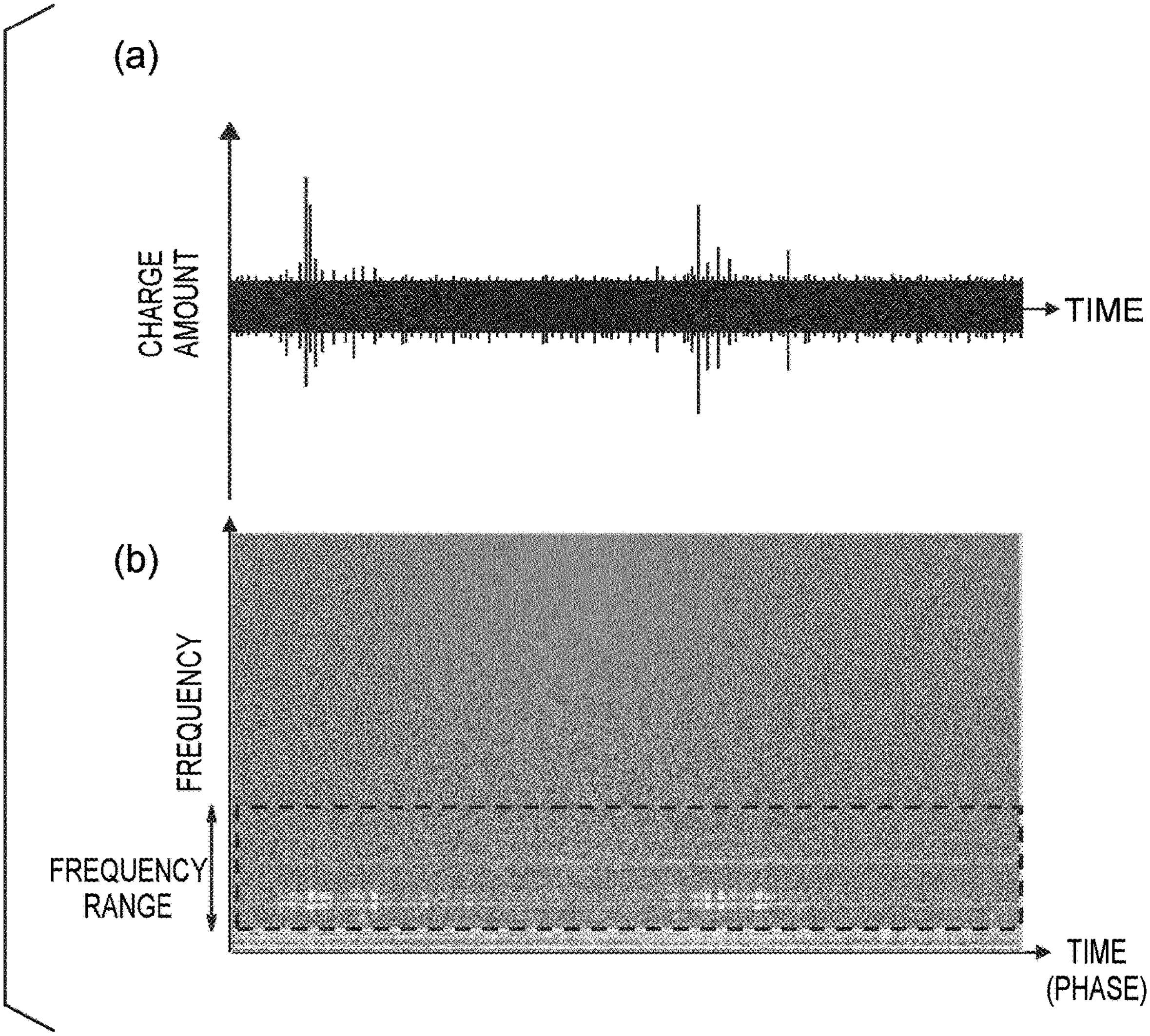
FIG. 17 is a diagram illustrating an example of selecting a frequency range by using a spectrogram.

FIG. 17 is a diagram illustrating an example in which the frequency range selector 302 selects a frequency range by using a spectrogram. FIG. 17(*a*) is a diagram illustrating an electric signal with partial discharge. The horizontal axis represents time, and the vertical axis represents the electric signal. FIG. 17(*b*) is a spectrogram regarding the electric signal with partial discharge. The horizontal axis represents time, and the vertical axis represents the frequency. In FIG. 17(*b*), the spectral intensity is stronger as the color density is lower due to the color density in the drawing.

As illustrated in FIG. 17(*b*), there is a frequency range in which the spectral intensity of the electric signal with partial discharge is larger than that of an electric signal without partial discharge. The frequency range selector 302 can extract a frequency range in which the spectral intensity exceeds a predetermined value as a feature amount of a partial-discharge signal. The feature amount can also be determined from a plurality of spectrograms. In this case, the frequency range selector 302 selects the widest range among frequency ranges determined for the respective spectrograms as the frequency range of the partial-discharge signal. Also in the case of the spectrogram, a frequency-related feature amount is extracted.

At this time, the frequency range selector 302 may select typical data from a plurality of spectrograms without partial discharge as the spectrogram without partial discharge that is to be subjected to comparison. Alternatively, the frequency range selector 302 may use data obtained by performing averaging on the spectrograms without partial discharge as the spectrogram without partial discharge that is to be subjected to comparison. Although the above description has been provided based on an electric signal (that can include a simulated electric signal) generated or acquired by the electric signal generator 102, the present embodiment is not limited thereto. Processing can be performed by using a desired electric signal. That is, a simulated electric signal, an electric signal acquired from an electric device that is an object of diagnosis, and the like can be used as the data used by the frequency range selector 302. An operator can also set selection of a frequency range to any range in advance.

The phase range selector 304 extracts a phase-related feature of a partial-discharge signal based on an electric signal (that can include a simulated electric signal) generated or acquired by the electric signal generator 102. The phase range selector 304 extracts a feature related to a phase range of the partial-discharge signal for each generation factor by using an electric signal for that generation factor.

Figure 18:
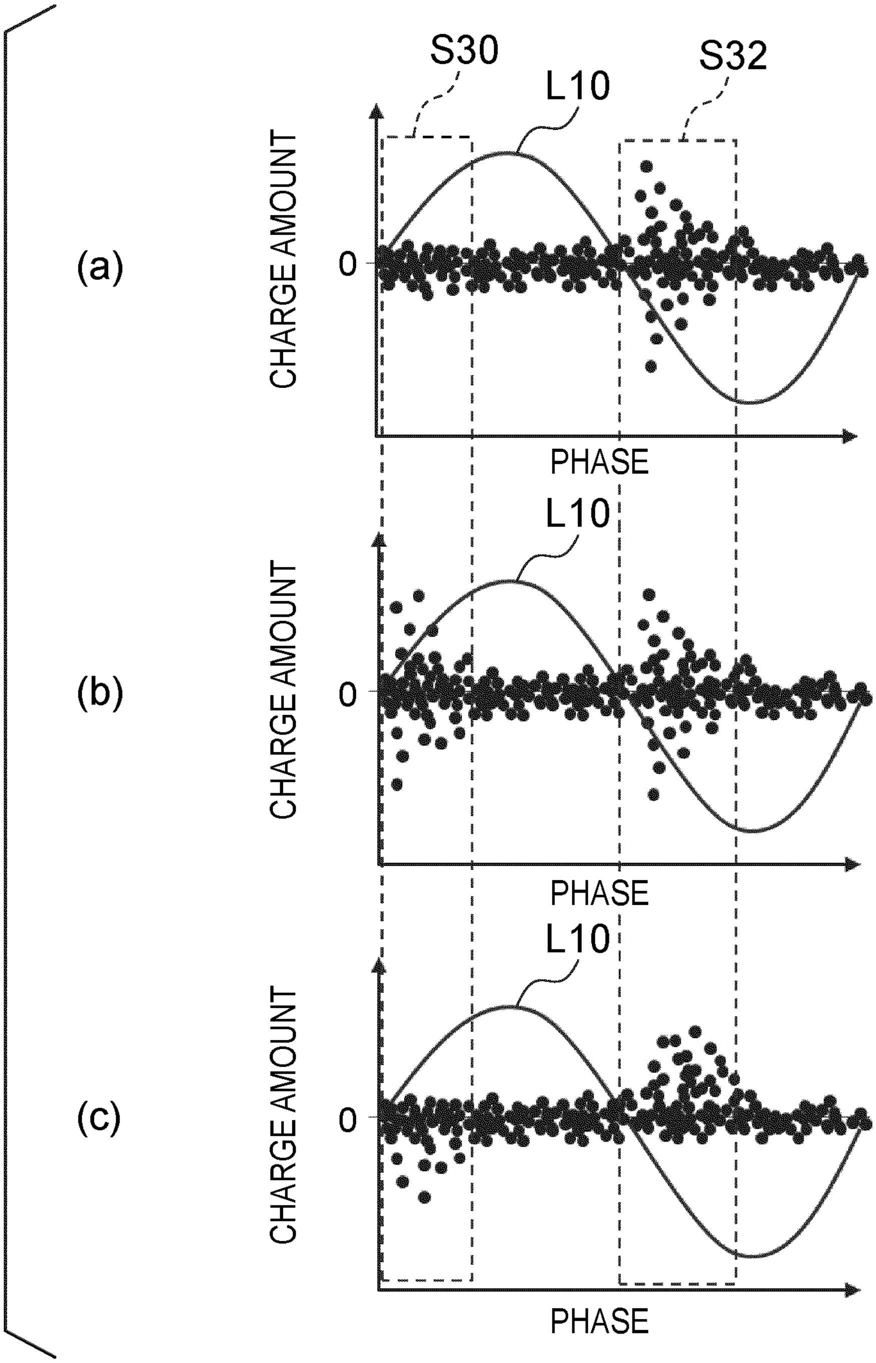
FIG. 18 is a diagram illustrating an example of a method of selecting a phase range from a φ-q-n pattern diagram.

FIG. 18 is a diagram illustrating an example of a method of selecting a phase range from a φ-q pattern diagram. The illustrated φ-q pattern diagrams are patterns obtained by accumulating the number of occurrences of charge amount over the entire period with regard to a plurality of electric signals. FIGS. 18(*a*), 18(*b*), and 18(*c*) are φ-q pattern diagrams for different simulated electric signals. The horizontal axis represents the phase (time), and the vertical axis represents the charge amount.

As illustrated in FIGS. 18(*a*), 18(*b*), and 18(*c*), the phase range selector 304 selects, with regard to the φ-q pattern diagram for each partial discharge factor, a phase range in which a partial-discharge signal is generated, and selects the widest range among the selected phase ranges for the respective partial discharge factors as a phase range of the partial-discharge signals. The phase range selector 304 can automatically set the phase range in accordance with the magnitude of the partial-discharge signal or the number of occurrences. Alternatively, the phase range selector 304 may determine a phase range based on an input signal of the operating device 30 by an operator.

The phase range selector 304 sets phase ranges S30 and S32 as two regions in FIGS. 18(*a*), 18(*b*), and 18(*c*). This is because it is considered that a partial-discharge signal is known as being generated around at least one of a range from 0° to 90° and a range from 180° to 270° of the phase of an applied voltage. However, the number of selected ranges may be set to any number.

Figure 19:
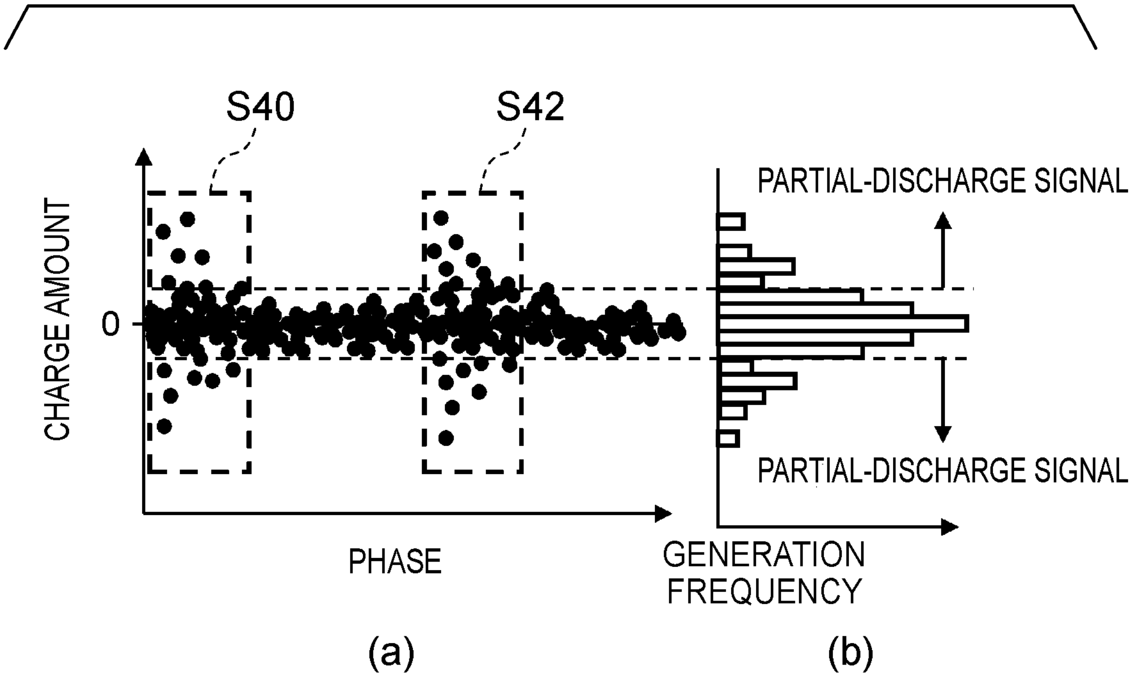
FIG. 19 is a diagram illustrating an example of generating a charge-amount histogram with respect to a charge amount.

The method of automatically setting the phase range of a partial-discharge signal by the phase range selector 304 is described more specifically with reference to FIG. 19. FIG. 19 is a diagram illustrating an example of generating a charge-amount histogram with respect to the charge amount in a φ-q pattern diagram. FIG. 19(*a*) is a φ-q pattern diagram for an electric signal with a partial-discharge signal. The horizontal axis represents the phase, and the vertical axis represents the charge amount. FIG. 19(*b*) is a charge-amount histogram of the φ-q pattern diagram in FIG. 19(*a*). The horizontal axis represents a generation frequency of charge amount, and the vertical axis represents the charge amount.

As illustrated in FIG. 19(*b*), the phase range selector 304 sets data exceeding a predetermined range as a partial-discharge signal, assuming the charge amount at which the generation frequency in the charge-amount histogram is the maximum as the center, and extracts one or more phase ranges in which the partial-discharge signal is generated as feature amounts S40 and S42.

Figure 20:
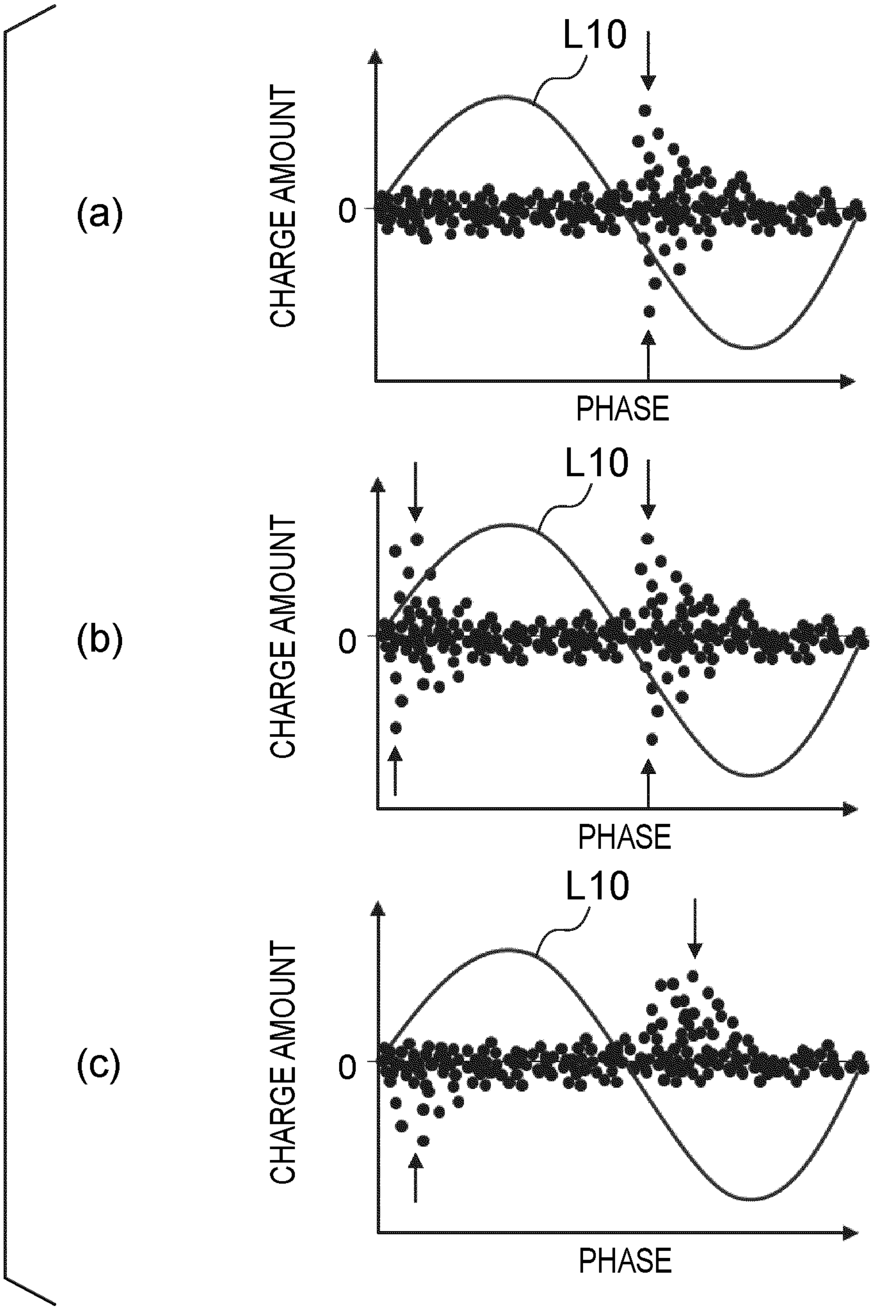
FIG. 20 is a diagram illustrating an example of a method of selecting a phase range from a peak position of data points in a φ-q pattern diagram.

FIG. 20 is a diagram illustrating an example of a method of selecting a phase range from the peak position of data points in a φ-q pattern diagram. FIGS. 20(*a*), 20(*b*), and 20(*c*) are φ-q pattern diagrams for different electric signals. The horizontal axis represents the phase (time), and the vertical axis represents the charge amount. In FIGS. 20(*a*), 20(*b*), and 20(*c*), a peak of a simulated electric signal is indicated with an arrow.

Figure 22:
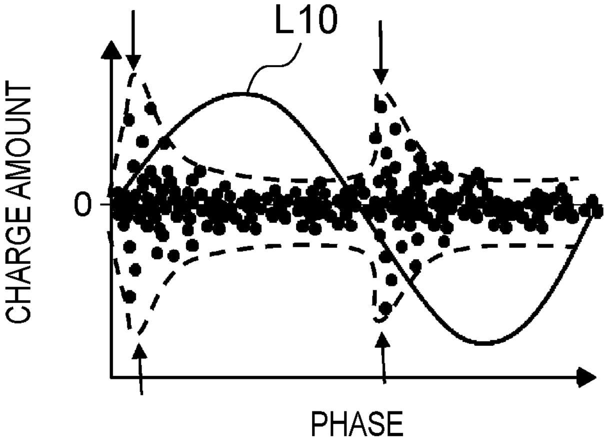
FIG. 22 is a diagram illustrating an example in which data points on a φ-q pattern diagram have been subjected to comprehensive processing.

As illustrated in FIGS. 20(*a*), 20(*b*), and 20(*c*), the phase range selector 304 can also select the phase range of a partial-discharge signal based on the peak position of a simulated electric signal in the φ-q pattern diagram for each partial discharge factor. The peak position may be selected as a data point at which the charge amount is the maximal (minimal). Alternatively, the peak position may be selected from the result of comprehensive processing of data as illustrated in FIG. 22 described later. The peak position can also be selected on signal data for one period. In this case, the phase range is set as a range having a statistical variation.

Figure 21:
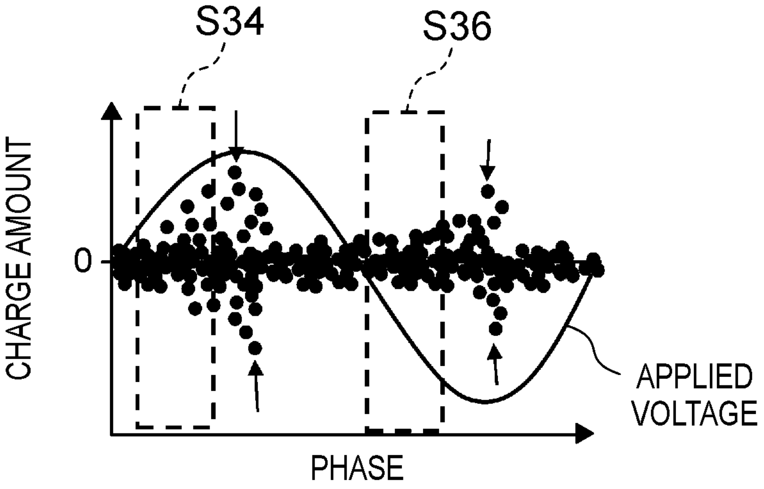
FIG. 21 is a φ-q pattern diagram in which pseudo partial discharge is indicated with an arrow.

FIG. 21 is a φ-q pattern diagram in which pseudo partial discharge is indicated with an arrow. The horizontal axis represents the phase (time), and the vertical axis represents the charge amount. In a case where the phase range selector 304 sets phase ranges S34 and S36 of the partial-discharge signal by using FIGS. 19(*a*) and 19(*b*) as described above, it is possible to statistically separate pseudo partial discharge and the partial-discharge signal, for example, even when the pseudo partial discharge occurs over a wide range of phase as illustrated in FIG. 21.

FIG. 22 is a diagram illustrating an example in which data points on a φ-q pattern diagram have been subjected to comprehensive processing. The horizontal axis represents the phase (time), and the vertical axis represents the charge amount. The phase range selector 304 can also select the peak position from the result of comprehensive processing of data as illustrated in FIG. 22.

Further, the phase range selector 304 can also select a phase range from the position of center of gravity of data points of a partial-discharge signal, similarly to the peak position, as the method of selecting a phase-related feature amount of the partial-discharge signal.

Furthermore, the phase range selector 304 may perform extraction of a phase-related feature of a partial-discharge signal for a spectrogram and a scalogram or may combine them. For example, when combining them, the phase range selector 304 selects the widest range among phase ranges determined for respective types of two-dimensional data as the phase range of the partial-discharge signal.

Figure 23:
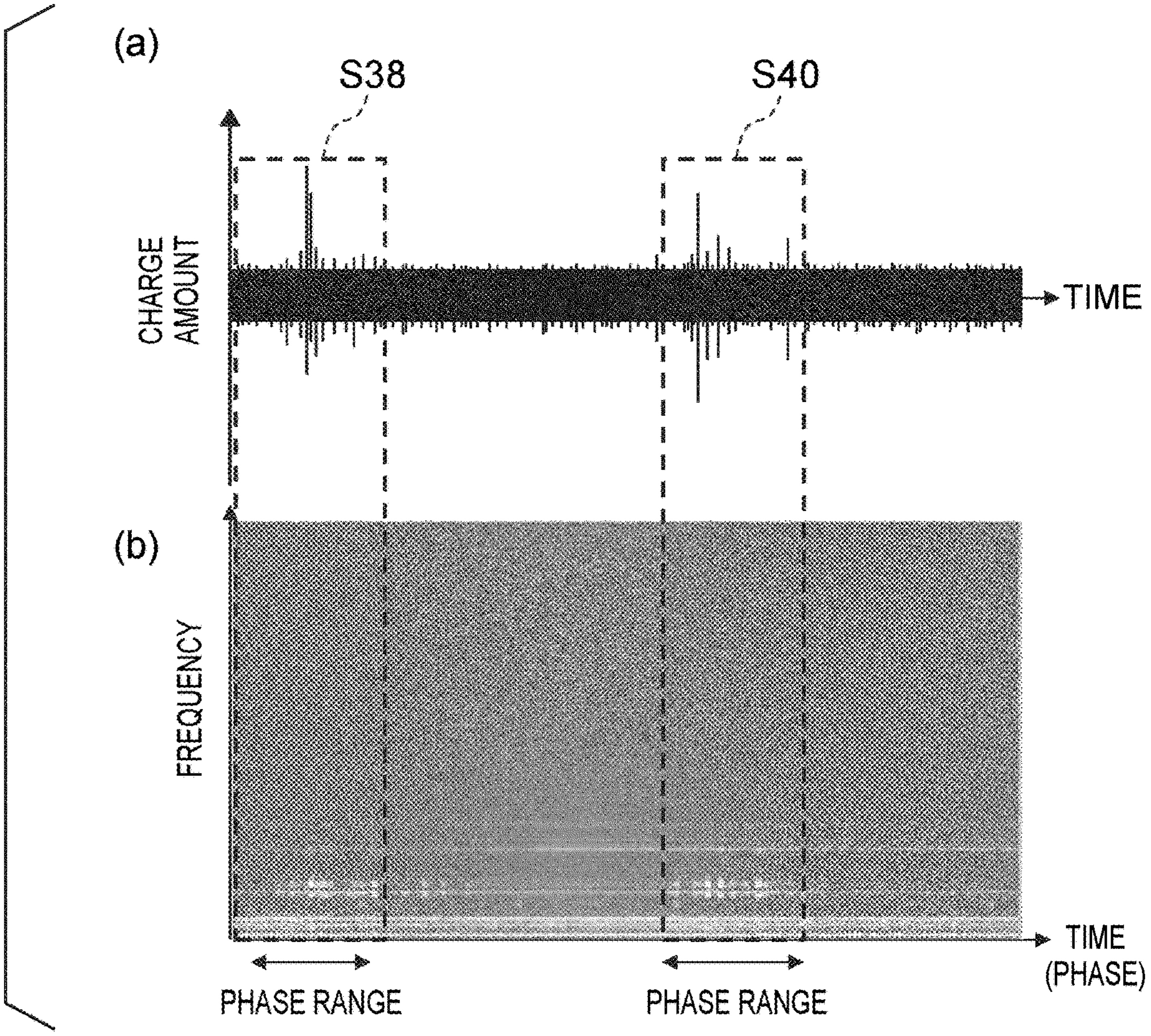
FIG. 23 is a diagram illustrating an example of selecting a phase range by using a spectrogram.

FIG. 23 is a diagram illustrating an example in which the phase range selector 304 selects a phase range by using a spectrogram. FIG. 23(*a*) is a diagram illustrating a simulated electric signal with partial discharge. The horizontal axis represents time, and the vertical axis represents the electric signal. FIG. 23(*b*) is a spectrogram regarding a simulated electric signal with partial discharge. The horizontal axis represents time, and the vertical axis represents the frequency. In FIG. 23(*b*), the spectral intensity is stronger as the color density is lower due to the color density in the drawing.

As illustrated in FIG. 23(*b*), there is a phase range in which the spectral intensity of an electric signal with partial discharge is larger than that of an electric signal without partial discharge. The phase range selector 304 can extract phase ranges S38 and S40 in which the spectral intensity exceeds a predetermined value as feature amounts of a partial-discharge signal. The feature amount can also be determined from a plurality of spectrograms. In this case, the phase range selector 304 selects the widest range among phase ranges determined for the respective spectrograms as the phase range of the partial-discharge signal. Also in the case of the spectrogram, a phase-related feature amount is extracted.

In this selection, the phase range selector 304 may select typical data from a plurality of spectrograms without partial discharge as the spectrogram without partial discharge that is to be subjected to comparison. Alternatively, the phase range selector 304 may use data obtained by performing averaging on the spectrograms without partial discharge as the spectrogram without partial discharge that is to be subjected to comparison. Although the description has been provided based on an electric signal (that can include a simulated electric signal) generated or acquired by the electric signal generator 102 as the data used by the phase range selector 304, the present embodiment is not limited thereto. Processing can be performed by using a desired electric signal. That is, a simulated electric signal, an electric signal acquired from an electric device that is an object of diagnosis, and the like can be used as the data used by the phase range selector 304. In addition, an operator can set selection of a phase range to any range in advance. As described above, the feature-amount extractor 104 can select a frequency range and a phase range in which a feature of a partial-discharge signal appears.

Processing Example of Partial-Discharge Diagnostic System

Figure 24:
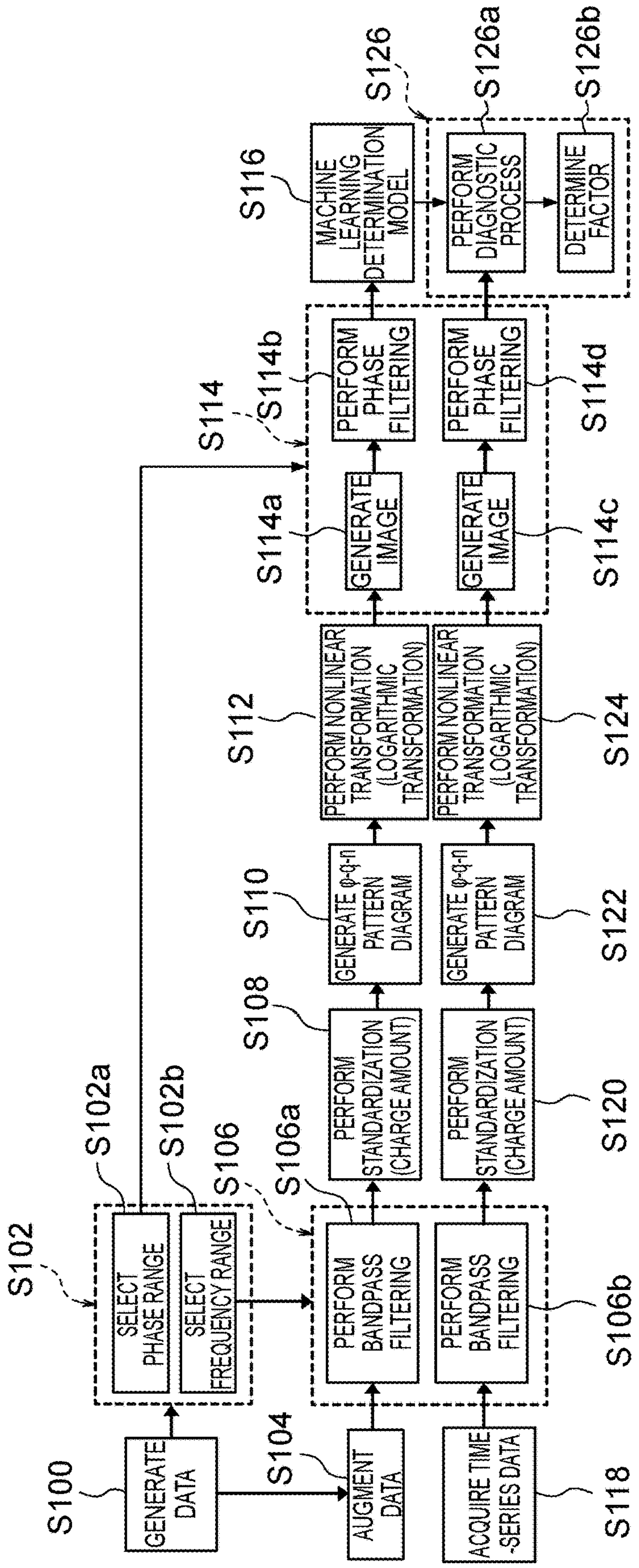
FIG. 24 is a flowchart of a processing example of a partial-discharge diagnostic system.

A processing example of the partial-discharge diagnostic system 1 is described with reference to FIGS. 25 to 29 by using FIG. 24. FIG. 24 is a flowchart of a processing example of the partial-discharge diagnostic system 1. The description is provided as to determination of a factor of a partial-discharge signal generated in a water turbine generator coil that is to be diagnosed as an example. It is assumed that data of charge amount measured by a sensor is used as an electric signal to be subjected to diagnosis. The electric signal to be subjected to diagnosis includes intermittent data obtained by always acquiring an electric signal from an electric device and also includes intermittent data regularly measured. Although the following description is provided by referring to the charge amount as the electric signal as an example, the present embodiment is not limited thereto. A signal varying with the phase can be used as the electric signal. For example, the electric signal may be a signal other than the charge amount signal, such as a current signal and a voltage signal.

Generation Process of Learning Model

First, the electric signal generator 102 generates an electric signal used for machine learning. The electric signal generator 102 performs a simulated test for a pattern of insulation deterioration that occurs in an insulating material of a generator coil to generate an electric signal for each partial discharge factor (Step S100). A pattern serving as each partial discharge factor has been acquired from a field device in advance. For example, the electric signal generator 102 simulates patterns serving as partial discharge factors as seven patterns A to G to generate electric signals for the respective partial discharge factors. One of the seven patterns A to G generates an electric signal without partial discharge.

Next, the operation part 200 of the data processor 106 generates a spectrogram for one period based on each of the generated electric signals (charge amount signals). Based on the spectrogram for one period, the frequency range selector 302 of the feature-amount extractor 104 selects a frequency range for each partial discharge factor (Step S102*a*), and the phase range selector 304 selects a phase range (Step S102*b*).

Next, the data augmenter 204 of the data processor 106 performs a data increasing process by averaging on the generated charge amount signals (Step S104). In this case, the process is performed to make the generation frequencies of the seven patterns serving as the partial discharge factors uniform. An averaging process may be performed on measured time-series data as illustrated in FIG. 12. By making the generated electric signals include the electric signal without partial discharge, it is also possible to perform comprehensive determination for data for which no partial-discharge signal has been generated.

Next, the filtering part 208 of the data processor 106 performs bandpass filtering on each charge amount signal for which the data increasing process has been performed, based on the selected frequency and phase ranges (Step S106*a*).

Next, the scale adjuster 202 of the data processor 106 performs standardization of charge amounts on the charge amount signals for which the bandpass filtering has been performed. In this case, standardization is performed with a value for which the maximum amplitude is obtained in one period of an applied voltage (Step S108).

Next, the operation part 200 of the data processor 106 generates a φ-q-n pattern diagram based on the charge amount signal after standardization (Step S110).

Next, the scale adjuster 202 of the data processor 106 performs logarithmic transformation as scale conversion for generation frequency in the φ-q-n pattern diagram of the charge amount signal (Step S112).

Figure 25:
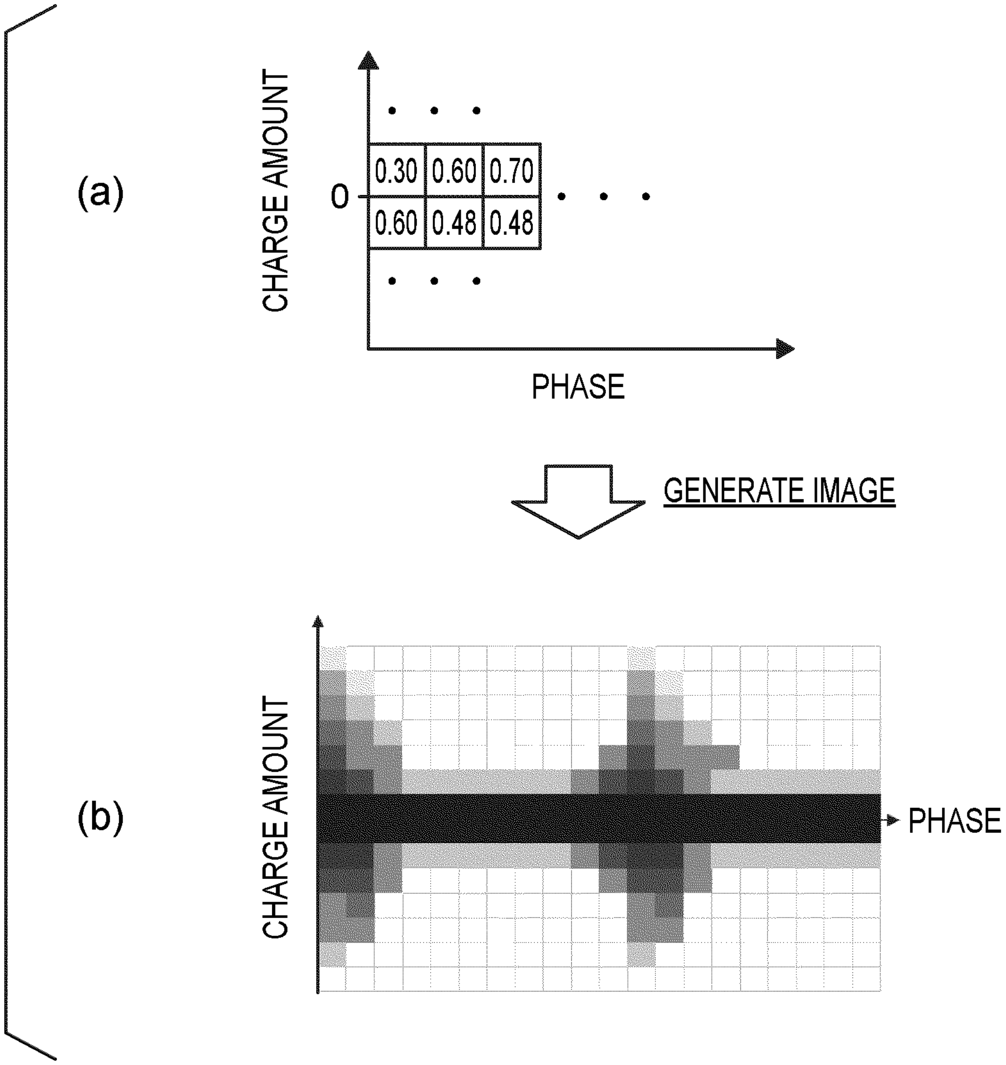
FIG. 25 is a diagram illustrating an example of an imaging process by an image generator.

Next, the image generator 108 converts the φ-q-n pattern of the charge amount signal to a two-dimensional grayscale image, thereby generating a φ-q-n pattern diagram image (Step S114*a*). FIG. 25 is a diagram illustrating an example of an imaging process by the image generator 108. FIG. 25(*a*) is a diagram illustrating an example of a φ-q-n pattern diagram of a charge amount signal. FIG. 25(*b*) is a diagram illustrating an example in which the pattern is converted to a two-dimensional grayscale image. The display controller 114 causes the display 20 to display the two-dimensional grayscale image of the φ-q-n pattern diagram. Accordingly, an operator can recognize a feature of the φ-q-n pattern diagram visually.

Subsequently, the filtering part 208 of the data processor 106 masks a phase region other than a phase range characteristic to the partial-discharge signal on the φ-q-n pattern diagram image of the charge amount signal based on the selected phase range (Step S114*b*).

Figure 26:
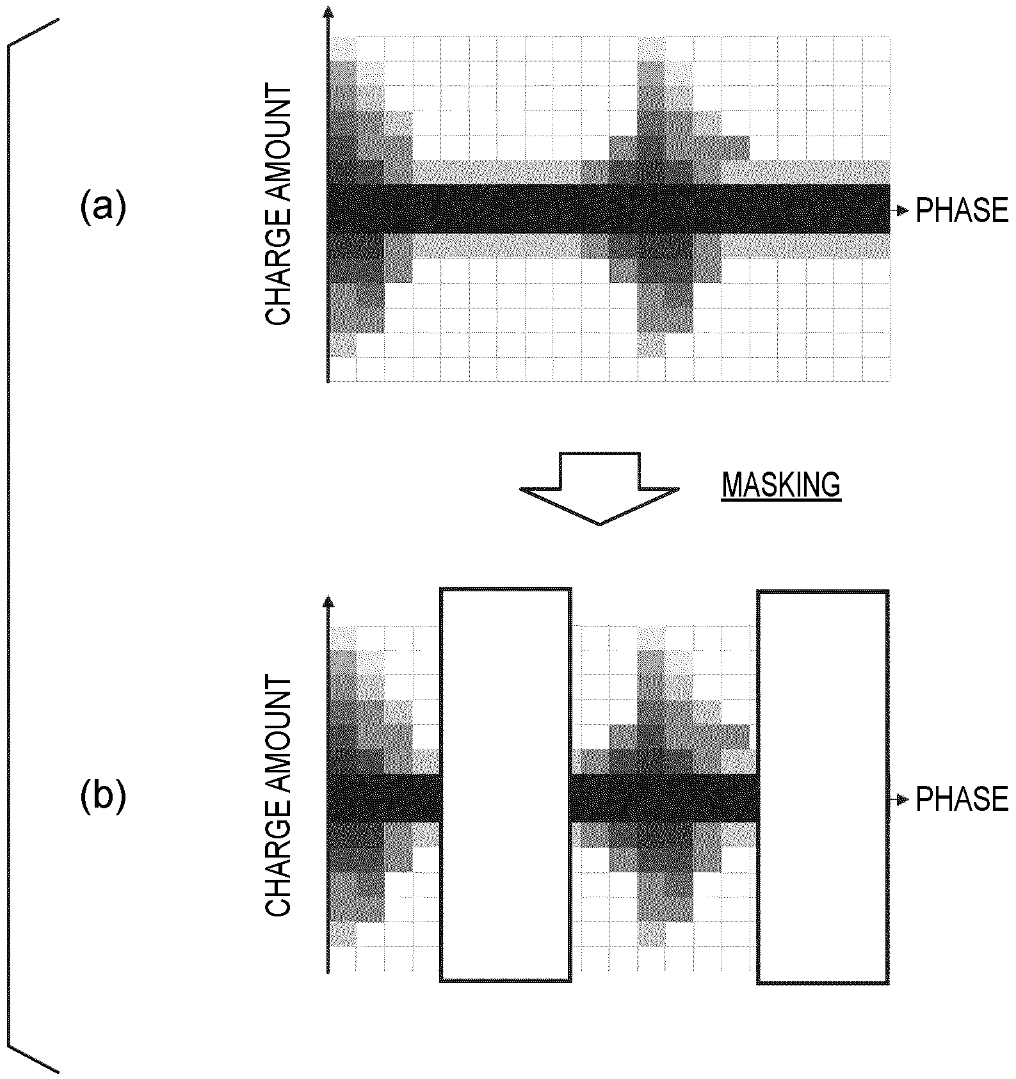
FIG. 26 is a diagram illustrating an example of masking by a filtering part.

FIG. 26 is a diagram illustrating an example of masking by the filtering part 208. FIG. 26(*a*) is a diagram illustrating an example of a two-dimensional grayscale image obtained by imaging. FIG. 26(*b*) is a diagram illustrating an example of the two-dimensional grayscale image that has been masked. Although data is deleted by masking in FIG. 26(*b*), the present embodiment is not limited thereto. For example, the filtering part 208 performs masking in such a manner that data values in the phase region other than the phase range become smaller. That is, the filtering part 208 reduces the data values in the phase region other than the phase range.

Next, the learning model generator 110 generates a learning model by using the masked φ-q-n pattern diagram image of the charge amount signal as learning data (Step S116). In this generation, any of the seven patterns A to G serving as the partial discharge factors is associated with the φ-q-n pattern diagram image as a teaching signal. Accordingly, this learning model outputs any of the seven patterns A to G serving as the partial discharge factors with respect to input of two-dimensional array data equivalent to the φ-q-n pattern diagram image.

Determination Process

Next, the description is provided as to a process of generating a φ-q-n pattern diagram image and performing determination with regard to a charge amount signal acquired from a water turbine generator coil that is an object of diagnosis, similarly to the learning model generation process.

The data acquirer 100 acquires a time-series electric signal (charge amount signal) from the measuring instrument 10 arranged on the water turbine generator coil that is the object of diagnosis (Step S118).

Figure 27:
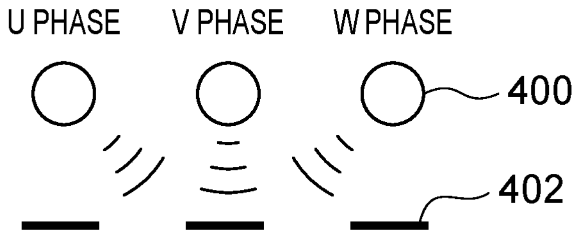
FIG. 27 is a diagram schematically illustrating an example of arrangement of a water turbine generator coil and sensors.

FIG. 27 is a diagram schematically illustrating an example of arrangement of a water turbine generator coil and sensors. Sensors 402 are arranged around conductors 400 for U-phase, V-phase, and W-phase, respectively. Examples of the sensor 402 include a partial discharge sensor that measures charge amount data. By disposing this sensor around a leading conductor of the water turbine generator, it is possible to easily acquire the charge amount data also in an existing plant.

As illustrated in FIG. 27, the sensors are arranged adjacent to each other around the leading conductors for U-phase, V-phase, and W-phase in some cases. For example, superimposition between difference phases occurs, as in the φ-q-n pattern diagram in FIGS. 3(*a*) to 3(*c*). Superimposition between different phases means that a signal for a phase other than a target phase is detected because a partial-discharge signal that has propagated to a leading conductor reaches three sensors.

The filtering part 208 of the data processor 106 selects a starting point of an applied voltage for each phase with regard to the charge amount signal acquired from the water turbine generator coil and changes phase information. At this time, the filtering part 208 changes the phase information in such a manner that the phases of the respective charge amount signals are coincident with one another.

Figure 28:
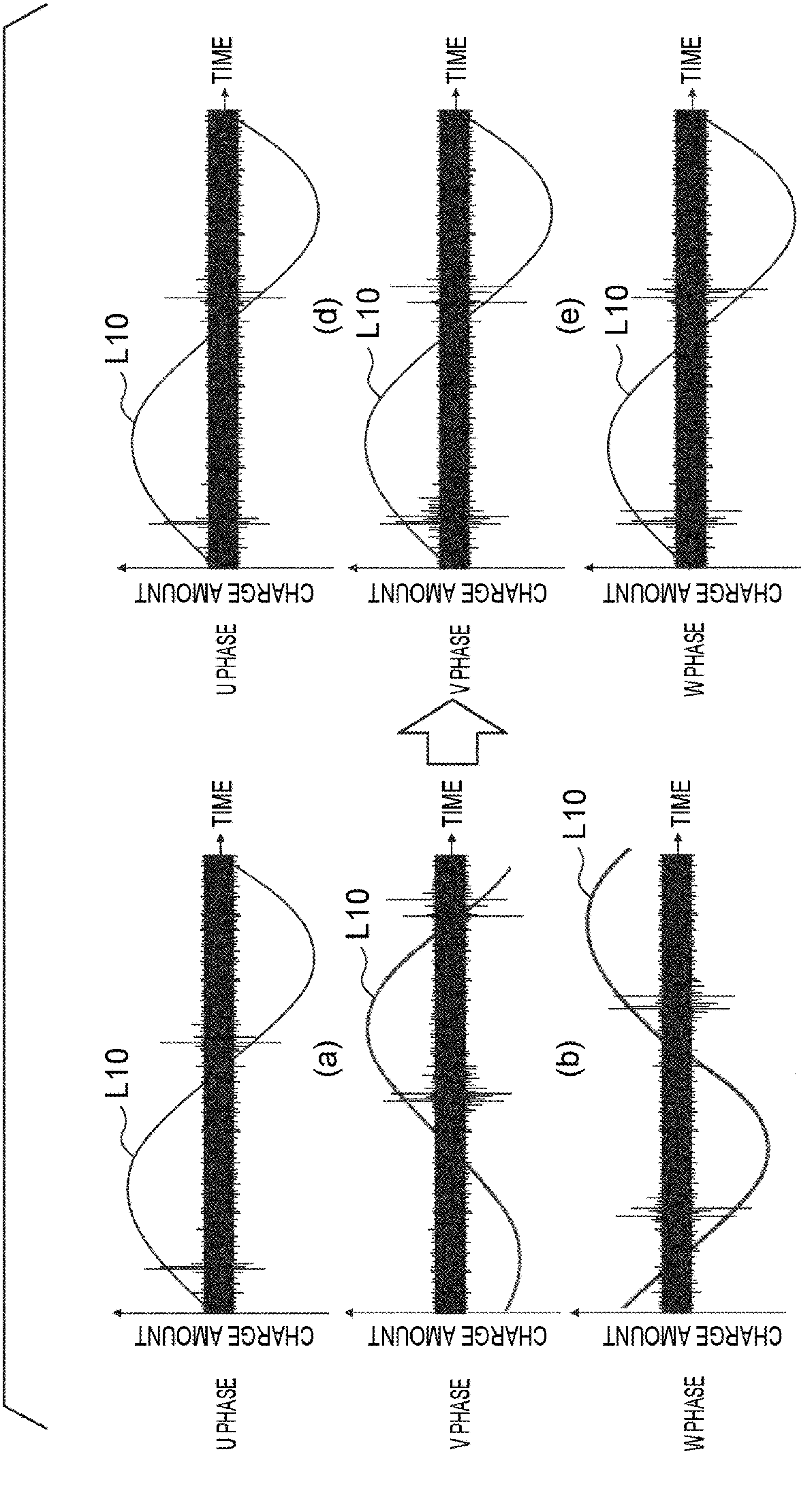
FIG. 28 is a diagram illustrating an example of a process of adjusting a starting point of an applied voltage by the filtering part.

FIG. 28 is a diagram illustrating an example of a process of adjusting a starting point of an applied voltage by the filtering part 208. The horizontal axis represents time, and the vertical axis represents the charge amount. FIGS. 28(*a*), 28(*b*), and 28(*c*) illustrate charge amount signals acquired from sensors arranged around leading conductors for U-phase, V-phase, and W-phase, respectively. FIGS. 28(*d*), 28(*e*), and 28(*f*) illustrate charge amount signals after starting point selection and change of phase information.

Next, the filtering part 208 of the data processor 106 performs bandpass filtering on each of the charge amount signals after the starting-point adjusting process, based on the frequency range and the phase range that have been selected (Step S106*b*).

Next, the scale adjuster 202 of the data processor 106 performs standardization of charge amounts on the charge amount signals for which the bandpass filtering has been performed. In this case, standardization is performed with a value for which the maximum amplitude is obtained in one period of an applied voltage (Step S120).

Next, the operation part 200 of the data processor 106 generates a φ-q-n pattern diagram based on the charge amount signal after standardization (Step S122).

Next, the scale adjuster 202 of the data processor 106 performs logarithmic transformation as scale conversion for generation frequencies in the φ-q-n pattern diagram of the charge amount signal (Step S124).

Next, the image generator 108 converts the φ-q-n pattern diagram of the charge amount signal after the starting-point adjusting process to a two-dimensional grayscale image, thereby generating a φ-q-n pattern diagram image (Step S114*c*).

Subsequently, the filtering part 208 of the data processor 106 masks a phase region other than a phase range characteristic to the partial-discharge signal on the φ-q-n pattern diagram image of the charge amount signal after the starting-point adjusting process based on the selected phase range (Step S114*d*).

Figure 29:
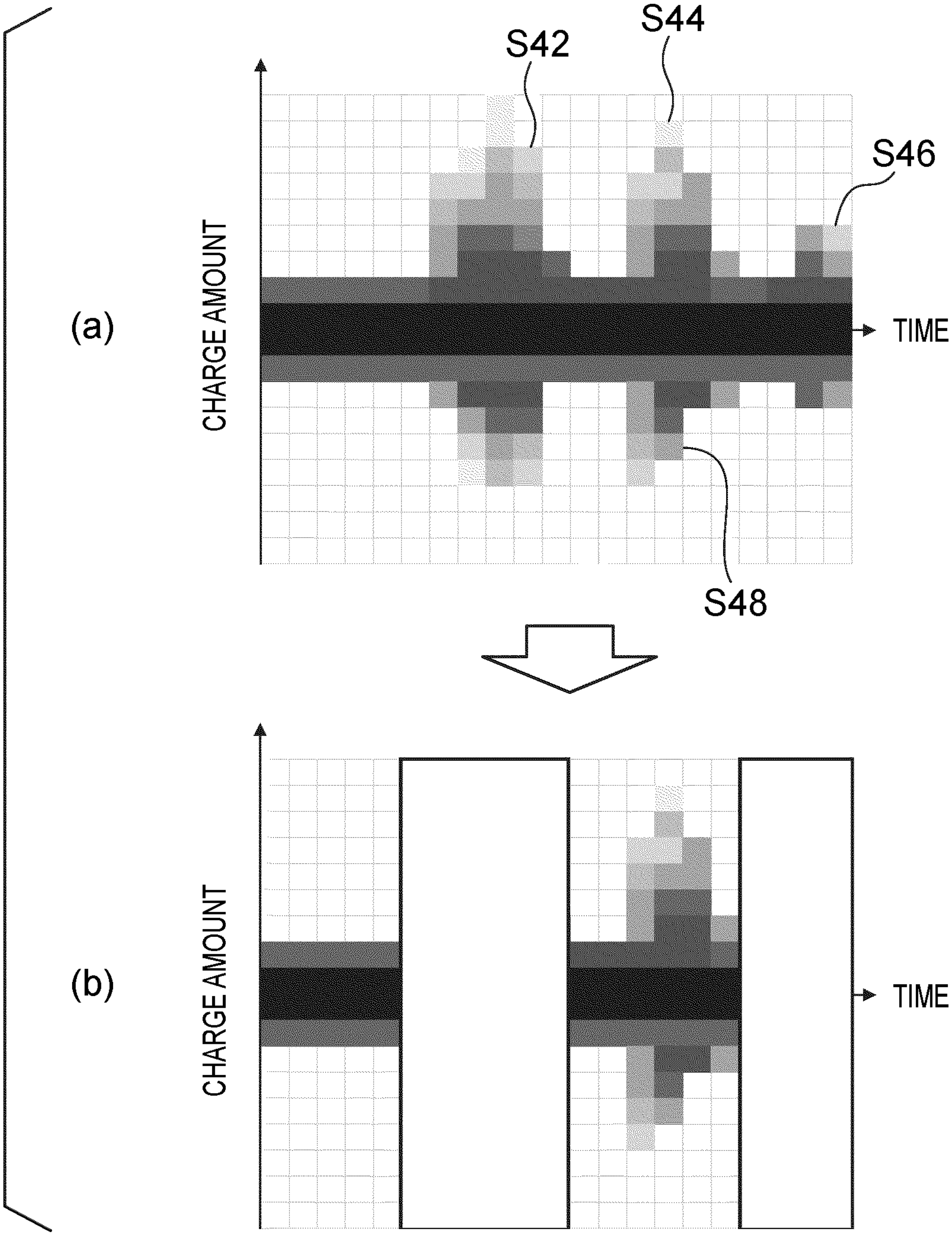
FIG. 29 is a diagram illustrating an example of masking by the filtering part.

FIG. 29 is a diagram illustrating an example of masking by the filtering part 208. FIG. 29(*a*) is a diagram illustrating an example in which the φ-q-n pattern diagram of the charge amount signal after the starting-point adjusting process is converted to a two-dimensional grayscale image. FIG. 29(*b*) is a diagram illustrating an example of the two-dimensional grayscale image that has been masked. Although data is deleted by masking in FIG. 29(*b*), the present embodiment is not limited thereto. For example, the filtering part 208 performs masking in such a manner that partial-discharge signals S44 and S48 in the phase range that is a feature amount are left whereas data values of charge amount signals S42 and S46 in a phase region outside the phase range are reduced. That is, the filtering part 208 reduces the data values in the phase region outside the phase range.

Next, the partial discharge determiner 112 performs a discrimination process using a learning model which has been learned, on the masked φ-q-n pattern diagram image of the charge amount signal as data for discrimination (Step S116). The partial discharge determiner 112 outputs any of the seven patterns A to G serving as the partial discharge factors as the discrimination result. As described above, this partial discharge determiner 112 performs determination of the presence or absence of partial discharge or determination of a generation factor with respect to input of two-dimensional array data equivalent to a φ-q-n pattern diagram image.

According to the embodiment described above, data in a predetermined format with a pseudo partial-discharge signal reduced in an electric signal varying with a phase is generated, and a learning model is generated based on the generated data, the learning model determining at least either a factor of partial discharge or the presence or absence of the partial discharge. By generating the learning model by machine learning based on data with the pseudo partial-discharge signal reduced as described above, it is possible to improve the accuracy of determination of a partial discharge factor of an electric device.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A partial-discharge diagnostic device capable of performing determination of a factor of partial discharge in an insulator, comprising:

a data augmenter configured to, for each factor, generate one or more second electric signals by combining one or more first electric signals that vary according to phase and performing averaging processing, thereby increasing a number of the one or more second electric signals relative to a number of the one or more first electric signals;

an operation part configured to generate φ-q-n characteristic data based on the one or more second electric signals; and a learning model generator configured to generate a learning model that determines the factor of partial discharge based on the φ-q-n characteristic data for each factor.

2. The device of claim 1, further comprising:

a scale adjuster configured to generate a third electric signal obtained by normalizing a magnitude of the one or more second electric signals, wherein the operation part generates φ-q-n characteristic data of the third electric signal, and the learning model generator determines the factor of partial discharge based on the φ-q-n characteristic data of the third electric signal.

3. The device of claim 2, further comprising:

a feature-amount extractor configured to extract, from the one or more second electric signals generated by the data augmenter, range information in which the partial discharge occurs as a feature amount; and a filtering part configured to generate a filtered second electric signal by suppressing, based on the feature amount, as a pseudo partial-discharge signal, an electric signal outside the range indicated by the range information, wherein the scale adjuster generates the third electric signal by normalizing a magnitude of the one or more second electric signals after the suppression processing.

4. The device of claim 2, wherein the scale adjuster is configured to adjust an intensity range of the one or more first electric signals.

5. The device of claim 4, wherein the one or more first electric signals include a signal indicating a charge amount corresponding to a phase of an applied voltage applied to an electric device, and the operation part is configured to divide a phase range and a charge amount range into a plurality of sections and generate, as the φ-q-n characteristic data, a generation frequency of the charge amount for each of regions defined by sections of the phase range and sections of the charge amount range.

6. The device of claim 5, wherein the scale adjuster is configured to convert the generation frequency nonlinearly.

7. The device of claim 1, wherein the operation part is configured to generate the φ-q-n characteristic data as image data having numerical values arranged in a two-dimensional array, and the device further comprises a display controller configured to cause a display device to display the image data.

8. The device of claim 7, further comprising a data acquirer configured to acquire the one or more first electric signals measured by a sensor attached to or around an electric device.

9. The device of claim 8, wherein the electric device includes at least one of a generator, an electric motor, an inverter device, a switch gear, or a cable, and the one or more first electric signals include a signal indicating at least one of a charge amount, a current, or a voltage corresponding to a phase of an applied voltage applied to the electric device.

10. The device of claim 9, further comprising an electric signal generator configured to perform at least one of generation of the one or more first electric signals for learning or acquiring of the one or more first electric signals for learning via the data acquirer.

11. The device of claim 10, wherein the electric signal generator is configured to generate the one or more first electric signals by using at least one of test data that simulates a condition of insulation deterioration or a result of simulation.

12. The device of claim 10, wherein the operation part is configured to generate the φ-q-n characteristic data based on the one or more first electric signals acquired by the data acquirer when determination is performed, and the device further comprises a partial discharge determiner configured to perform determination of a generation factor by using the learning model based on the φ-q-n characteristic data.

13. A partial-discharge diagnostic method of performing determination of a factor of partial discharge in an insulator, comprising:

for each factor, generating, by using a data augmenter, one or more second electric signals by combining one or more first electric signals that vary according to phase and performing averaging processing, thereby increasing a number of the one or more second electric signals relative to a number of the one or more first electric signals;

generating, by using an operation part, φ-q-n characteristic data based on the one or more second electric signals; and generating, by using a learning model generator, a learning model that determines the factor of partial discharge based on the φ-q-n characteristic data for each factor.

14. A partial-discharge diagnostic system that performs determination of a factor of partial discharge in an insulator, comprising:

a measuring instrument configured to measure one or more first electric signals that varies according to phase by a sensor attached to or around an electric device; and a partial-discharge diagnostic device, wherein the partial-discharge diagnostic device includes a data augmenter configured to, for each factor, generate one or more second electric signals by combining the one or more first electric signals that vary according to phase and performing averaging processing, thereby increasing a number of the one or more second electric signals relative to a number of the one or more first electric signals;

an operation part configured to generate o-q-n characteristic data based on the one or more second electric signals; and a learning model generator configured to generate a learning model that determines the factor of partial discharge based on the φ-q-n characteristic data for each factor.

15. A partial-discharge diagnostic device capable of performing determination of a factor of partial discharge in an insulator, comprising:

a data augmenter configured to generate, for each factor, one or more second electric signals by combining one or more first electric signals that vary according to phase and performing averaging processing, thereby increasing a number of the one or more second electric signals relative to a number of the one or more first electric signals;

an operation part configured to generate characteristic data indicating a phase of the one or more second electric signals and a frequency for each characteristic value of the one or more second electric signals and a learning model generator configured to generate a learning model that determines the factor of partial discharge based on the characteristic data for each factor.

16. A partial-discharge diagnostic device capable of performing determination of a factor of partial discharge in an insulator, comprising:

a data augmenter configured to, for each factor, generate one or more second electric signals by combining one or more first electric signals that vary according to phase and performing averaging processing, thereby increasing a number of the one or more second electric signals relative to a number of the one or more first electric signals;

an operation part configured to generate characteristic data for each phase and each characteristic value of the one or more second electric signals; and a learning model generator configured to generate a learning model that determines the factor of partial discharge based on the characteristic data for each factor.

* * * * *